(12) United States Patent
Iwamoto et al.

(10) Patent No.: US 7,684,764 B2
(45) Date of Patent: Mar. 23, 2010

(54) DUPLEXER USING SURFACE ACOUSTIC WAVE FILTERS AND ELECTRONIC DEVICE EQUIPPED WITH THE SAME

(75) Inventors: Yasuhide Iwamoto, Kawasaki (JP); Shogo Inoue, Kawasaki (JP); Jun Tsutsumi, Kawasaki (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 506 days.

(21) Appl. No.: 10/834,273

(22) Filed: Apr. 29, 2004

(65) Prior Publication Data

US 2004/0219888 A1 Nov. 4, 2004

(30) Foreign Application Priority Data

Apr. 30, 2003 (JP) ............................... 2003-126089

(51) Int. Cl.
*H04B 1/40* (2006.01)
(52) U.S. Cl. .................... 455/76; 333/133; 333/193; 333/195; 455/75
(58) Field of Classification Search ................. 333/133, 333/193–196
See application file for complete search history.

(56) References Cited

U.S. PATENT DOCUMENTS 6,466,103 B2   10/2002   Iwamoto et al.
6,501,344 B2 *  12/2002  Ikata et al. .................... 333/133
6,919,778 B2 *   7/2005  Iwamoto et al. ............. 333/133
7,135,944 B2 *  11/2006  Iwamoto et al. ............. 333/133
2001/0040487 A1 * 11/2001 Ikata et al. ................... 333/133

FOREIGN PATENT DOCUMENTS

| CN | 1368831 A | 9/2002 |
|---|---|---|
| JP | 63-200545 | 8/1988 |
| JP | 4-46404 | 2/1992 |
| JP | 7-226607 | 8/1995 |
| JP | 8-18393 | 1/1996 |
| JP | 10-75153 | 3/1998 |
| JP | 10-126213 | 5/1998 |
| JP | 2001-320260 | 11/2001 |
| JP | 2001-339273 | 12/2001 |
| JP | 2002-176337 | 6/2002 |
| JP | 2003-304139 | 10/2003 |
| KR | 2001-0103579 A | 11/2001 |

* cited by examiner

*Primary Examiner*—Duc Nguyen
*Assistant Examiner*—Zhiyu Lu
(74) *Attorney, Agent, or Firm*—Arent Fox LLP

(57) ABSTRACT

A duplexer includes two surface acoustic wave (SAW) filters having different center frequencies; a phase matching circuit that matches phases of the two SAW filters; a package in which the SAW filters and the phase matching circuit are housed, the package being composed of multiple layers; and a line pattern provided between at least one of the SAW filters and at least one of a transmit terminal and a receive terminal of the duplexer. The line pattern runs on at least two of the multiple layers within a range defined by peripheral ground patterns provided in the package.

10 Claims, 23 Drawing Sheets

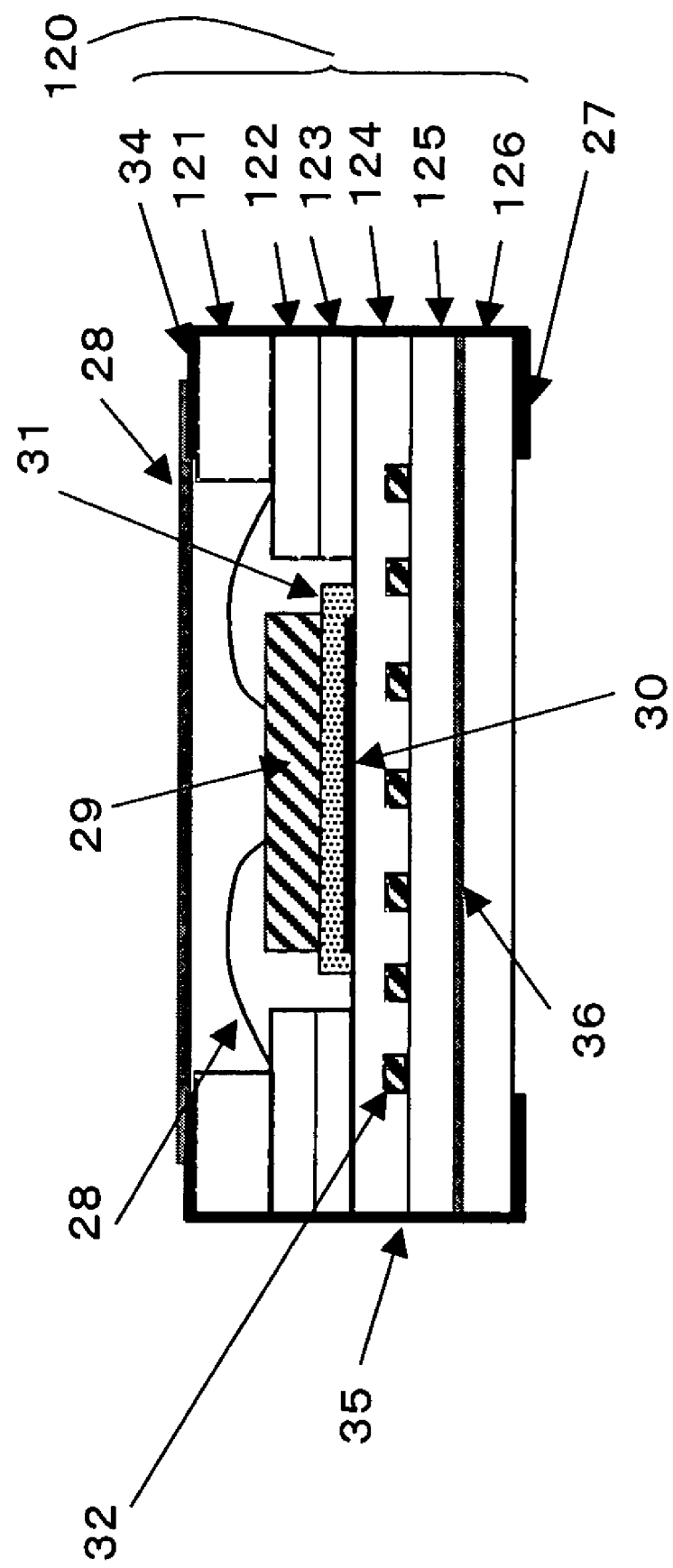

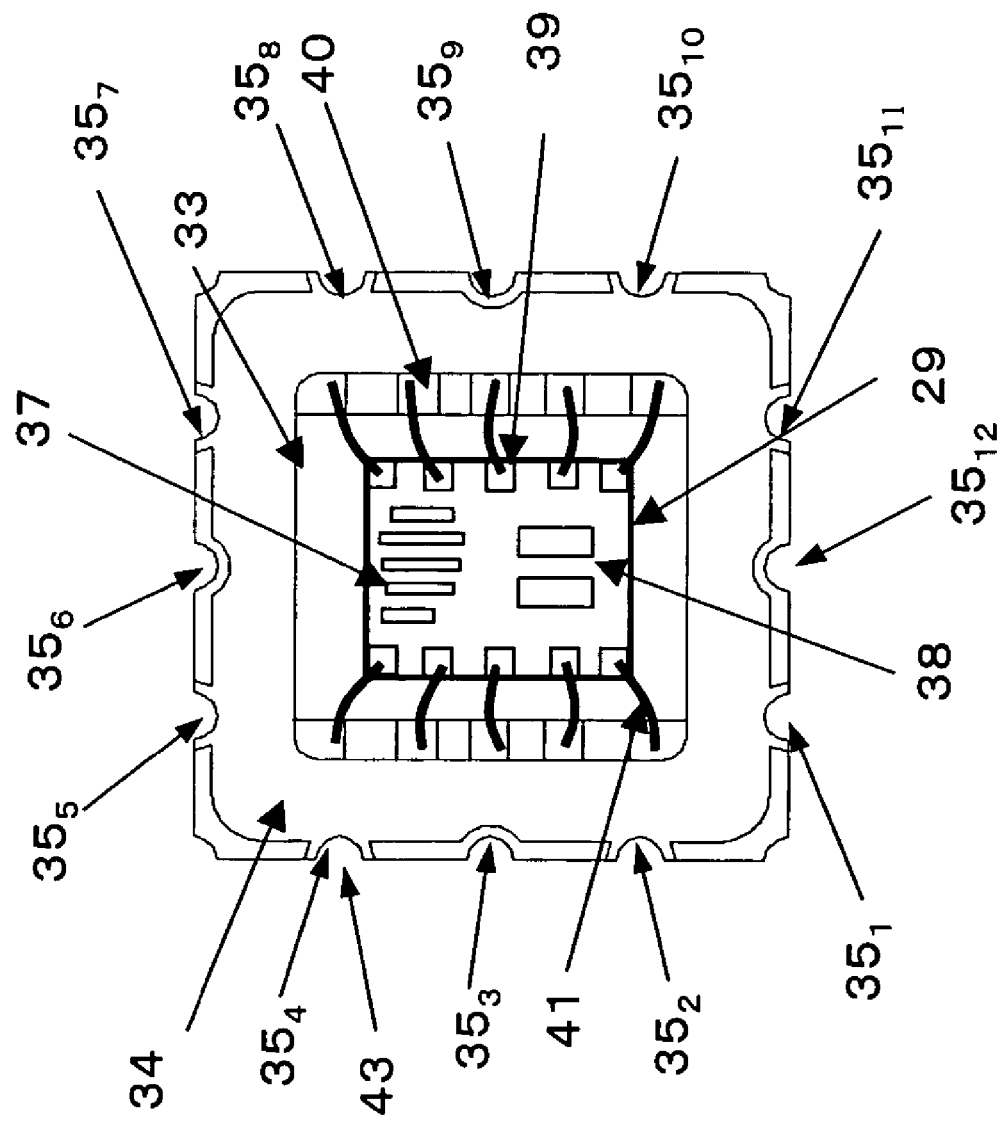

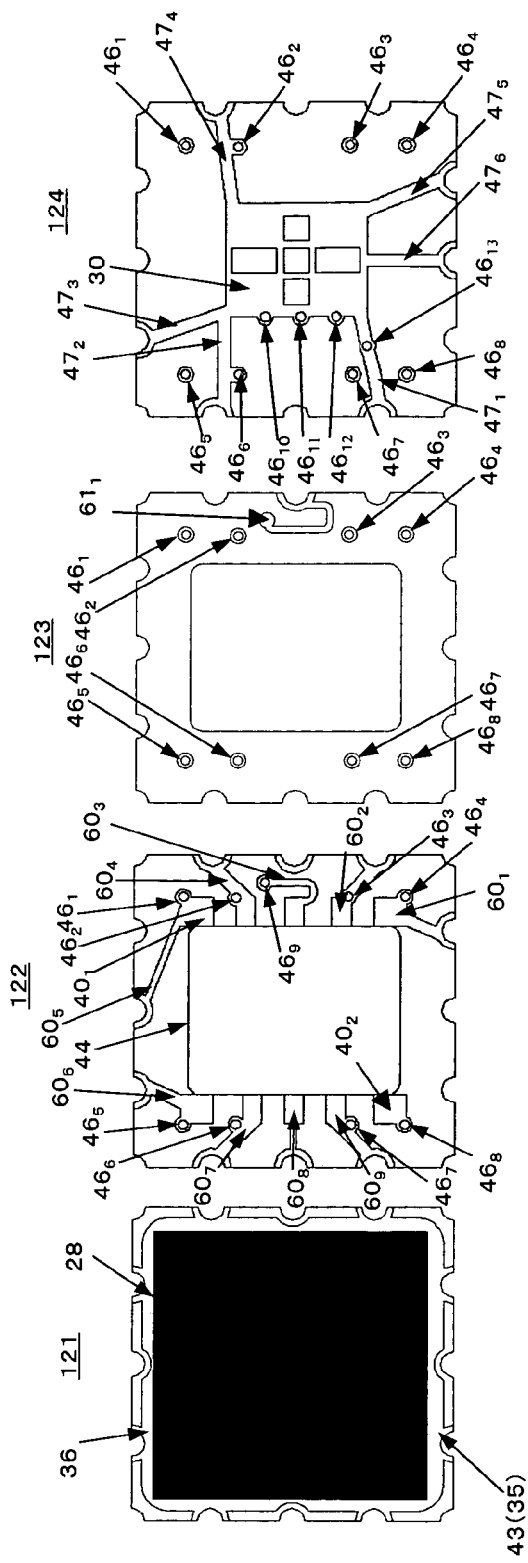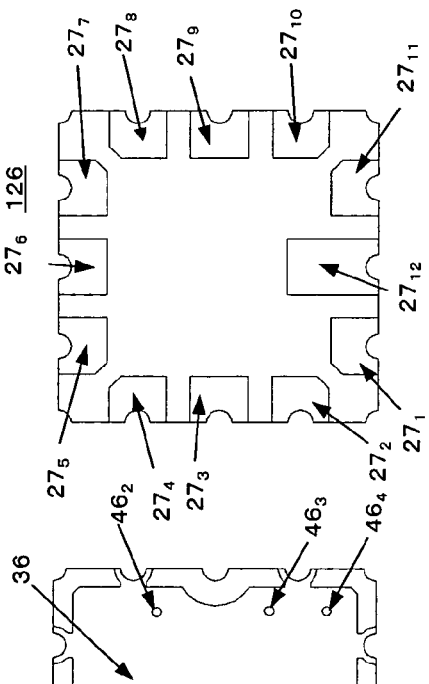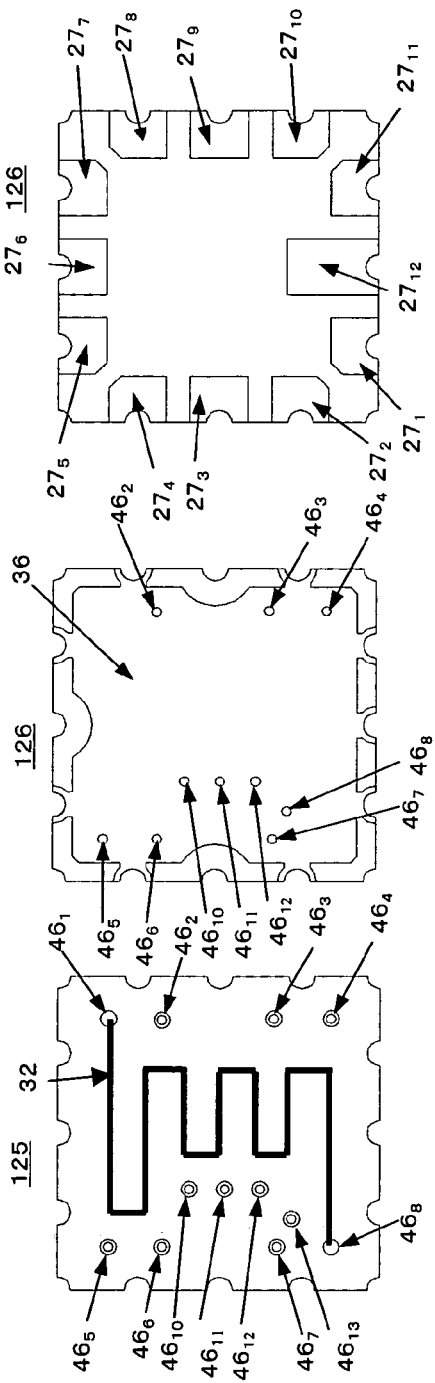

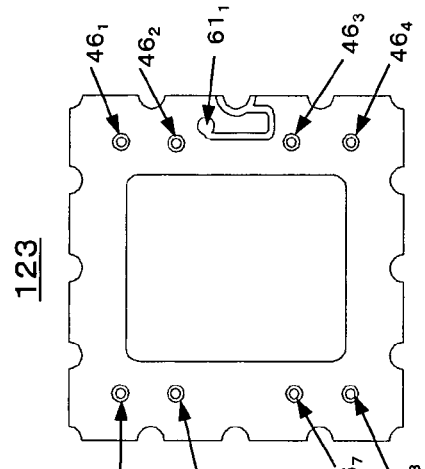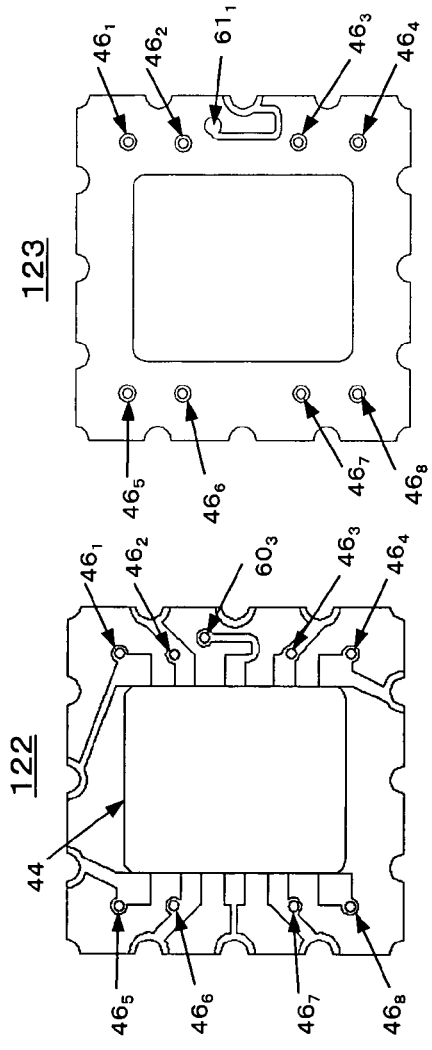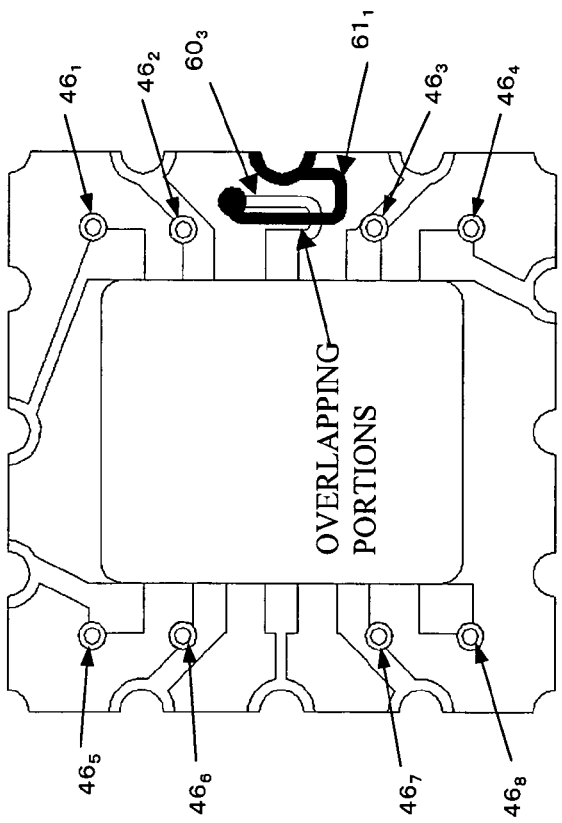
Fig. 6A
Fig. 6B
Fig. 6C

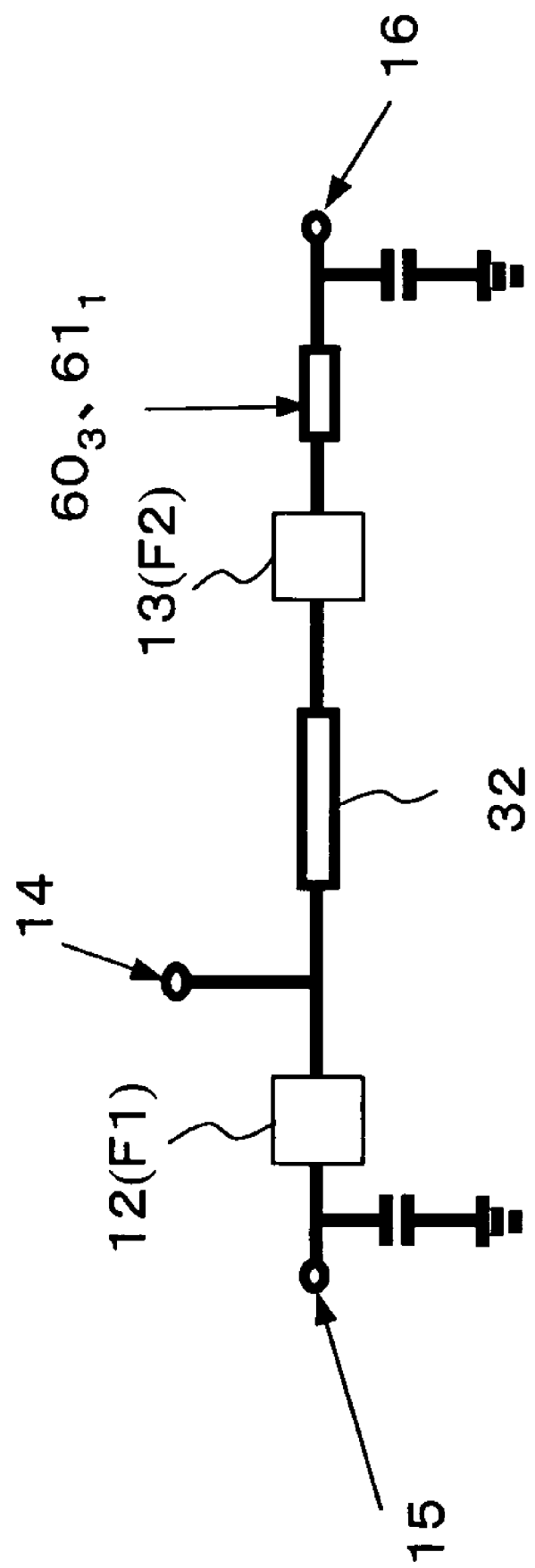

① --- PRIOR ART
② —— INVENTION (PHASE MATCHING LINE PATTERN IS ADDED TO RECEIVE CIRCUIT

REFLECTION CHARACTERISTIC OF RECEIVE PORT

CHARACTERISTIC IMPEDANCE OF
PHASE MATCHING LINE PATTERN
AT RX PORT IS 61 Ω

CHARACTERISTIC IMPEDANCE OF
PHASE MATCHING LINE PATTERN
AT RX PORT IS 78 Ω

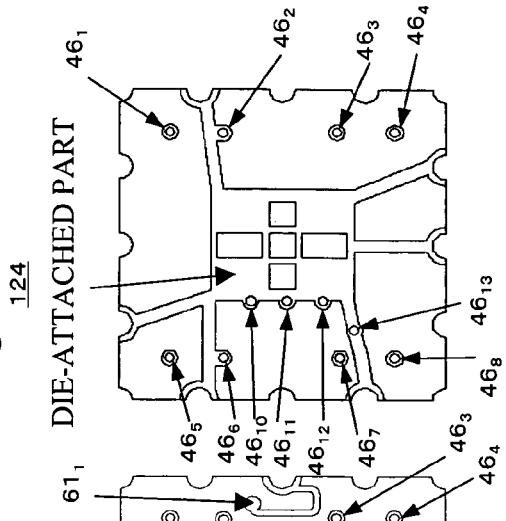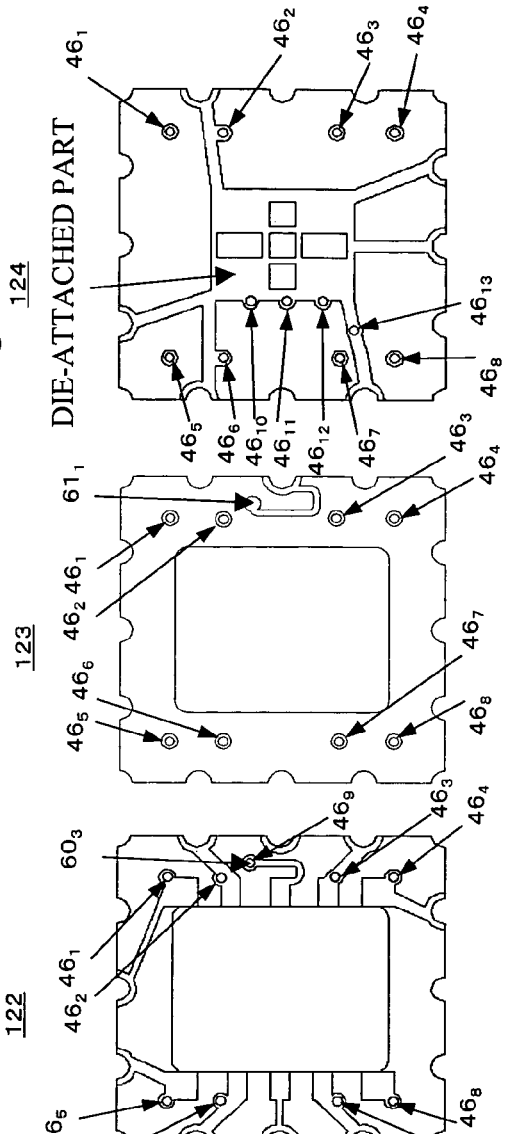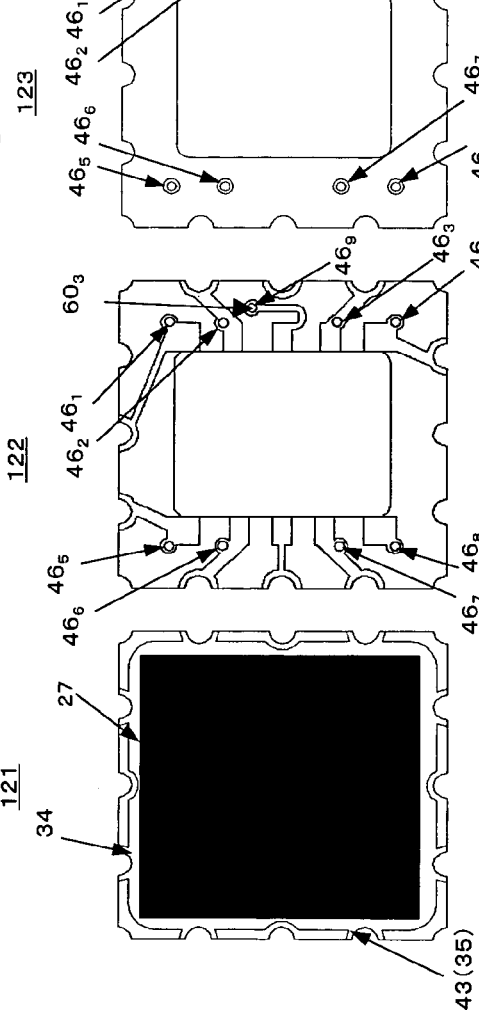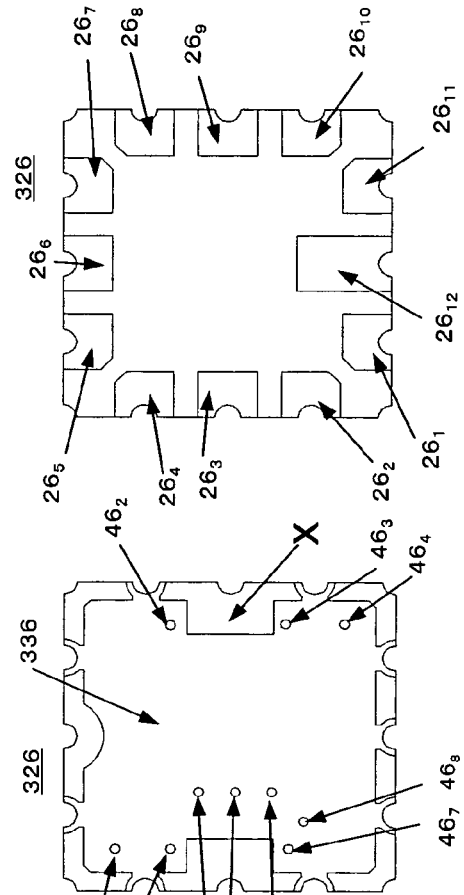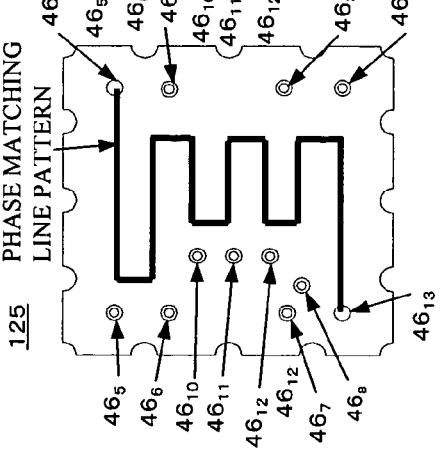

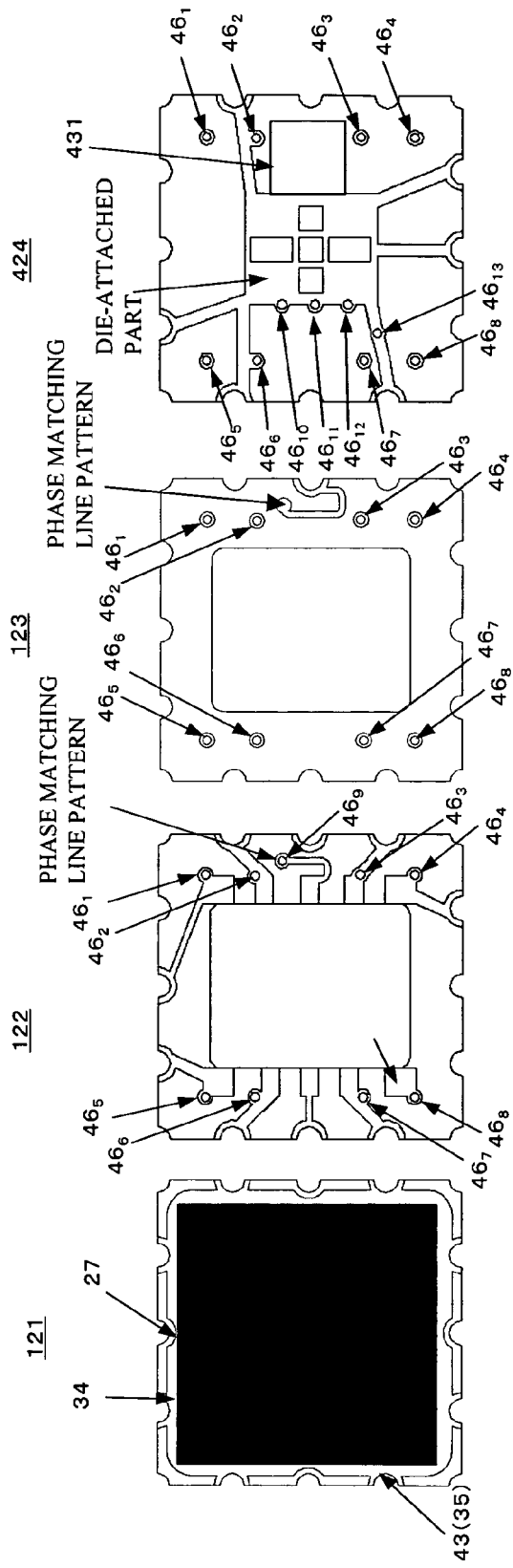
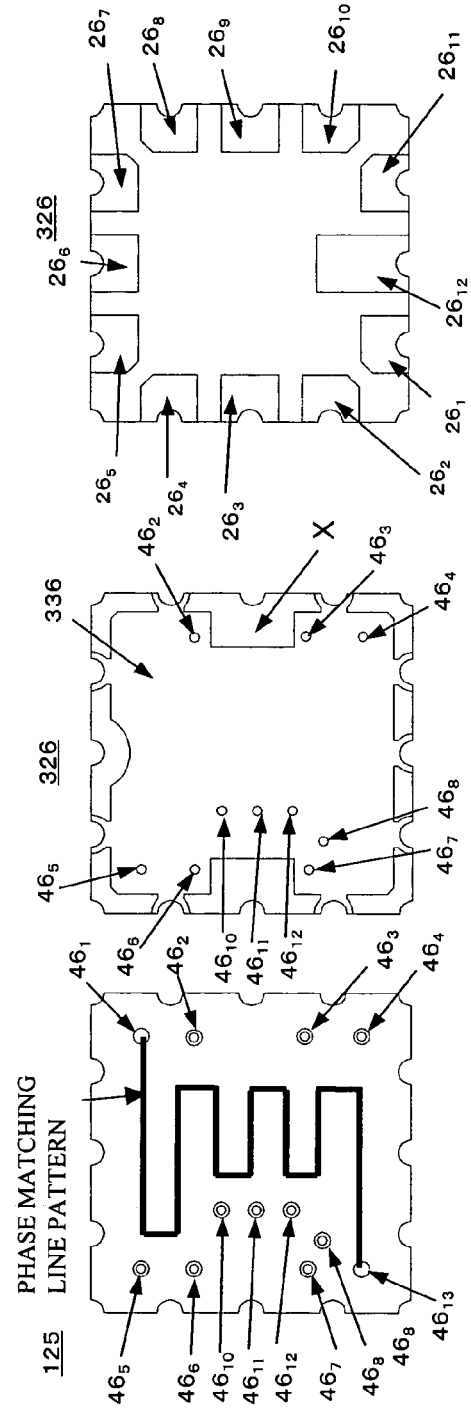

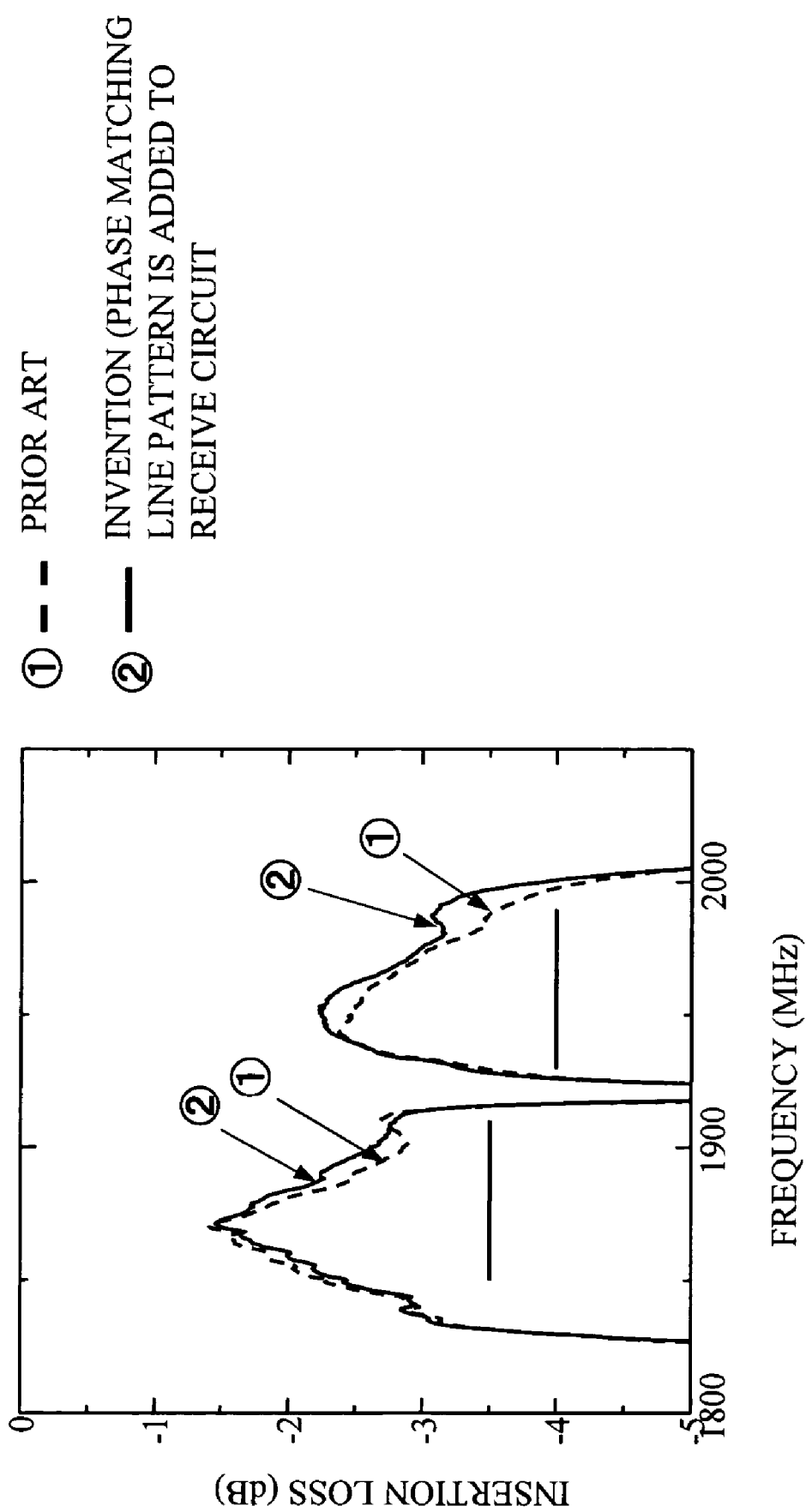

REFLECTION CHARACTERISTIC OF RECEIVE PORT

① - - - PRIOR ART

② ——— INVENTION (PHASE MATCHING LINE PATTERN IS ADDED TO RECEIVE CIRCUIT

REFLECTION CHARACTERISTIC OF TRANSMIT PORT

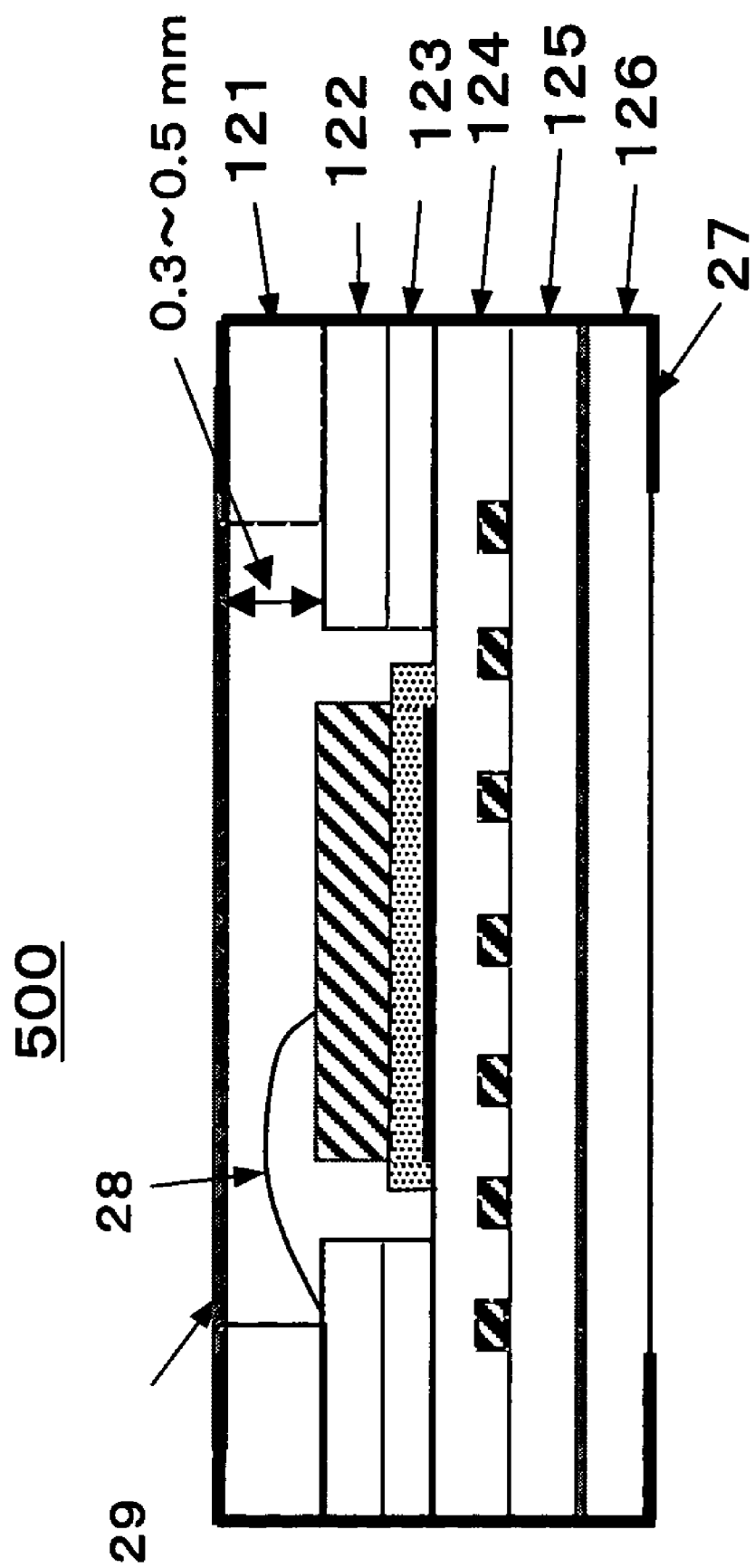

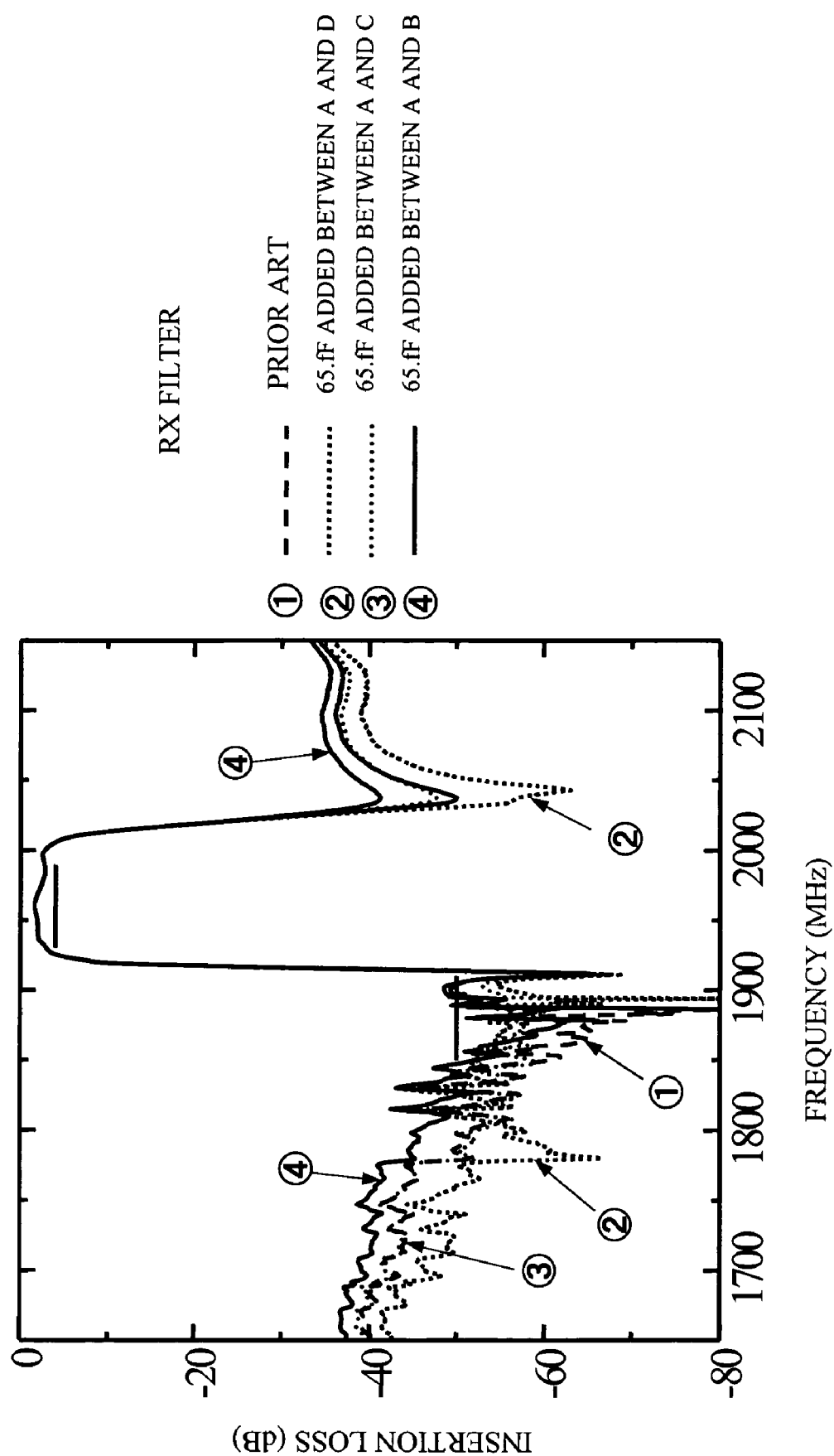

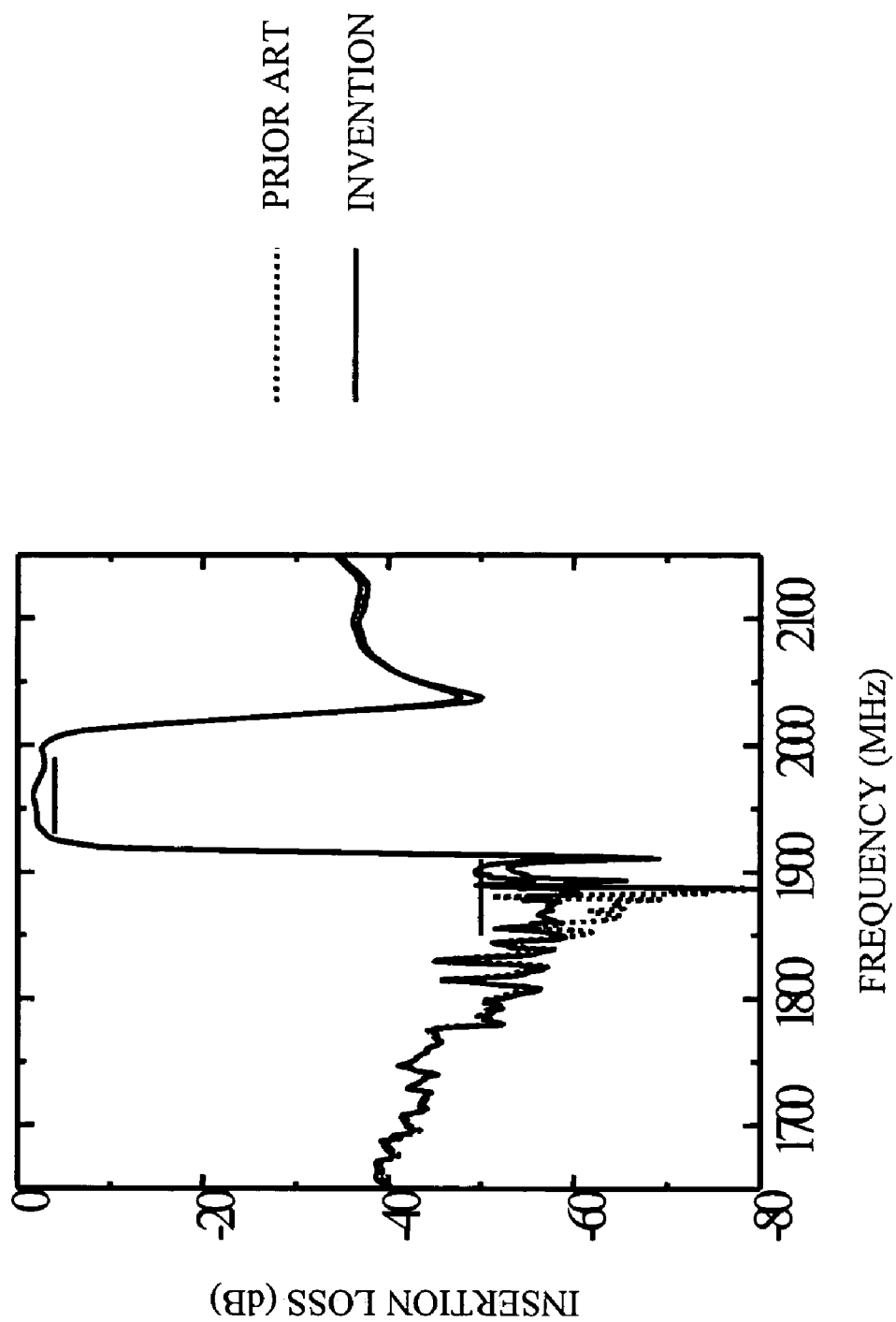

DUPLEXER USING SURFACE ACOUSTIC WAVE FILTERS AND ELECTRONIC DEVICE EQUIPPED WITH THE SAME

BACKGROUND OF THE INVENTION

1. Field of the Invention

The present invention generally relates to a duplexer using surface acoustic wave filters and an electronic apparatus using the same.

2. Description of the Related Art

Recently, cellular phones and portable information equipment have spread widely along with the development of mobile communications systems. It has been considerable activity in downsizing and improving the terminal equipment among many manufacturers. Some cellular phones deal with both the analog and digital systems and employ a variety of frequency bands such as the 800 MHz-1 GHz band and 1.5 GHz-2.0 GHz band.

The recent development of cellular phones is directed to expanding the terminal functions that follow diversified system specifications. For instance, there are dual-mode cellular phones having the analog and digital systems, and dual-frequency cellular phones conforming to TDMA (Time Division Multiple Access) and CDMA (Code Division Multiple Access). There are also dual-band cellular phones that handle two bands such as the combination of the 800 MHz band and the 1.9 GHz band, or the combination of the 900 MHz band and the 1.8 GHz or 1.5 GHz band. This trend requires improved performance of parts employed in these cellular phones, such as filters. It is also required to downsize the equipment and reduce the cost.

There are some types of antenna duplexers used in sophisticated terminal equipment. A dielectric type duplexer uses a dielectric for transmit and receive filters. A composite filter uses a dielectric for one to the transmit and receive filters and a surface acoustic wave (SAW) filter for the other. There is yet another type of duplexer that employs SAW filters only. The dielectric type duplexer has a relatively large size and has difficulty in downsizing and thinning the portable terminal equipment. The composite filter has the same problem as mentioned above.

The duplexer with SAW filters has a module type in which filters and a phase matching circuit are mounted on a printed-circuit board. An integral type has a ceramic multilayer package that houses the transmit and receive filters and the phase matching circuit. These filters have a volume approximately equal to ⅓ to ¹⁄₁₅ of that of the dielectric type duplexer and a height approximately equal to ½ to ⅓ of that. The downsized and thinned SAW duplexer can be produced at almost the same cost as the cost of producing the dielectric-type duplexer.

There are several proposals directed to downsizing. Japanese Patent Application Publication No. 10-126213 discloses a multilayer ceramics package and a wiring pattern for phase matching that runs on two layers of the ceramics package. Japanese Patent Application Publication No. 8-18393 discloses another proposal to arrange a phase matching wiring pattern on two layers of a package. Japanese Patent Application No. 10-75153 discloses a phase matching line pattern on multiple layers of a package. Japanese Patent Application No. 2001-339273 discloses phase matching line patterns on an outer wall of a package.

However, these proposals have the following problems. Japanese Patent Application Publication No. 10-1262123 employs wires for making connections with the chip and thus has a problem about downsizing. Further, each of SAW filters of a packaged duplexer needs a respective phase matching circuit.

Japanese Patent Application Publication Nos. 10-1262143 and 8-18393 show the phase matching line is arranged associated with only the antenna terminal and no phase matching line is provided in connection with the transmit and/or receive terminal. It may be considered that the proposals are directed to the 800 MHz band duplexers having less influence of the parasitic impedance of the package than that of the 2 GHz band duplexers. The proposed duplexers do not operate appropriately in the 2 GHz band due to a phase mismatch between the transmit and receive systems.

The duplexer disclosed in Japanese Patent Application No. 10-75153 does not operate appropriately in a high-frequency band such as the 2 GHz band because the phase matching lines associated with the transmit and receive terminals have a single-layer structure.

Japanese Patent Application No. 2001-339273 has a difficulty in downsizing because the phase matching line patterns are provided on the outer walls of the package.

SUMMARY OF THE INVENTION

It is an object of the present invention to provide a down-sized duplexer having a highly reliable filter characteristic.

This object of the present invention is achieved by a duplexer comprising: two surface acoustic wave (SAW) filters having different center frequencies; a phase matching circuit that matches phases of the two SAW filters; a package in which the SAW filters and the phase matching circuit are housed, the package being composed of multiple layers; and a line pattern provided between at least one of the SAW filters and at least one of a transmit terminal and a receive terminal of the duplexer, the line pattern running on at least two of the multiple layers within a range defined by peripheral ground patterns provided in the package.

According to another aspect of the present invention, there is provided a duplexer comprising: two surface acoustic wave (SAW) filters having different center frequencies; a phase matching circuit that matches phases of the two SAW filters; and a package in which the SAW filters and the phase matching circuit are housed, the package being composed of multiple layers, one of the multiple layers having a first surface on which at least one of a transmit footpad and a receive footpad is provided, and a second surface on which a ground pattern is provided so as not to overlap said one of the transmit footpad and the receive footpad.

According to yet another aspect of the present invention, there is provided a duplexer comprising: two surface acoustic wave (SAW) filters having different center frequencies; a phase matching circuit that matches phases of the two SAW filters; and a package in which the SAW filters and the phase matching circuit are housed, the package being composed of multiple layers, the multiple layers having a first layer on which a transmit footpad or a receive footpad is provided, and a second layer on which the phase matching circuit is provided, the first and second layers being next to each other, the phase matching circuit having a line pattern having a portion close to one of the transmit and receive footpads.

According to a further aspect of the present invention, there is provided an electronic apparatus comprising: an antenna; a duplexer connected to the antenna; and transmit and receive systems connected to the duplexer, the duplexer being structured as described above.

BRIEF DESCRIPTION OF THE DRAWINGS

Other objects, features and advantages of the present invention will become apparent from the following detailed description when read in conjunction with the accompanying drawings, in which:

FIG. 3 is a vertical sectional view of a duplexer according to a first embodiment of the present invention;

FIG. 4 is a plan view of the duplexer shown in FIG. 3 from which a cap has been removed;

FIGS. 5A, 5B, 5C, 5D, 5E, 5F and 5G are plan views of layers of a package of the duplexer shown in FIG. 3;

FIGS. 6A, 6B and 6C show phase matching line patterns provided between a SAW filter and a receive terminal;

FIG. 7 is an equivalent model of the duplexer according to the first embodiment of the invention;

FIGS. 11A, 11B, 11C, 11D, 11E, 11F and 11G are plan views of layers of a duplexer according to a third embodiment of the present invention;

FIGS. 12A, 12B, 12C, 12D, 12E, 12F and 12G are plan view of layers of a duplexer according to a fourth embodiment of the present invention;

FIG. 13 is a graph of a filter characteristic of the duplexer according to the fourth embodiment of the present invention;

FIG. 15 is a vertical sectional view of a duplexer according to a fifth embodiment of the present invention;

FIG. 20 is a graph of a frequency characteristic of a receive filter of the duplexer according to the seventh embodiment of the present invention;

FIG. 22 is a graph of a frequency characteristic of the duplexer according to the eighth embodiment of the present invention.

DESCRIPTION OF THE PREFERRED EMBODIMENTS

Figure 1:
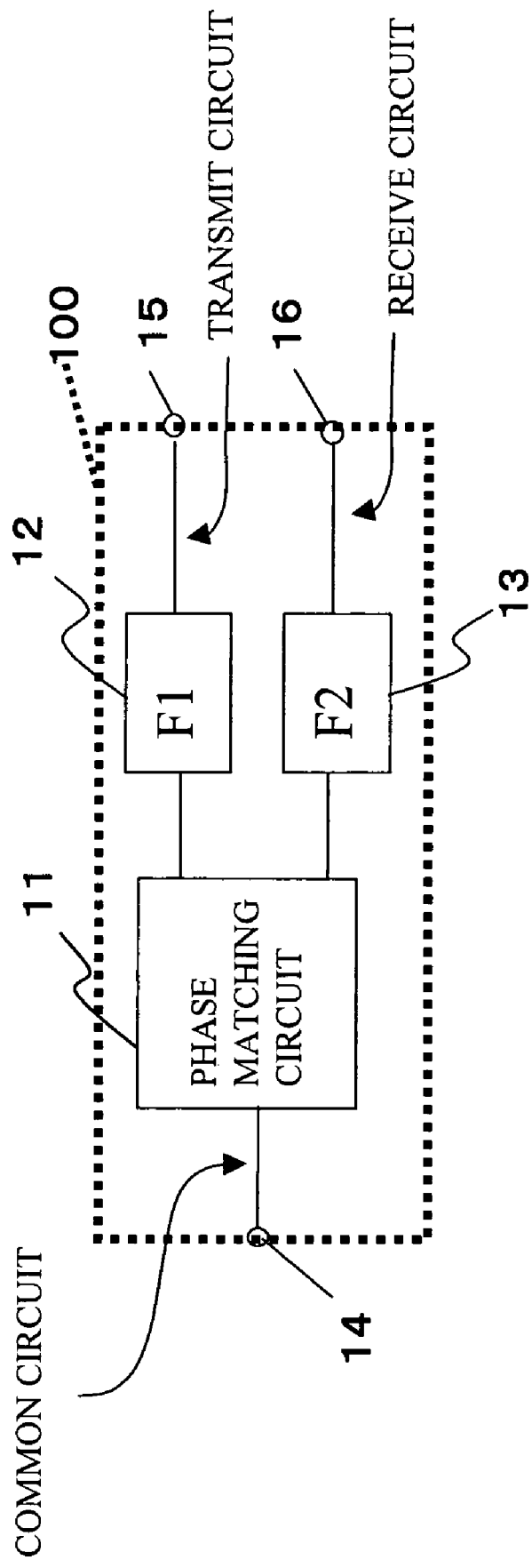
FIG. 1 is a block diagram of an outline of a duplexer according to an embodiment of the present invention.
Figure 2:
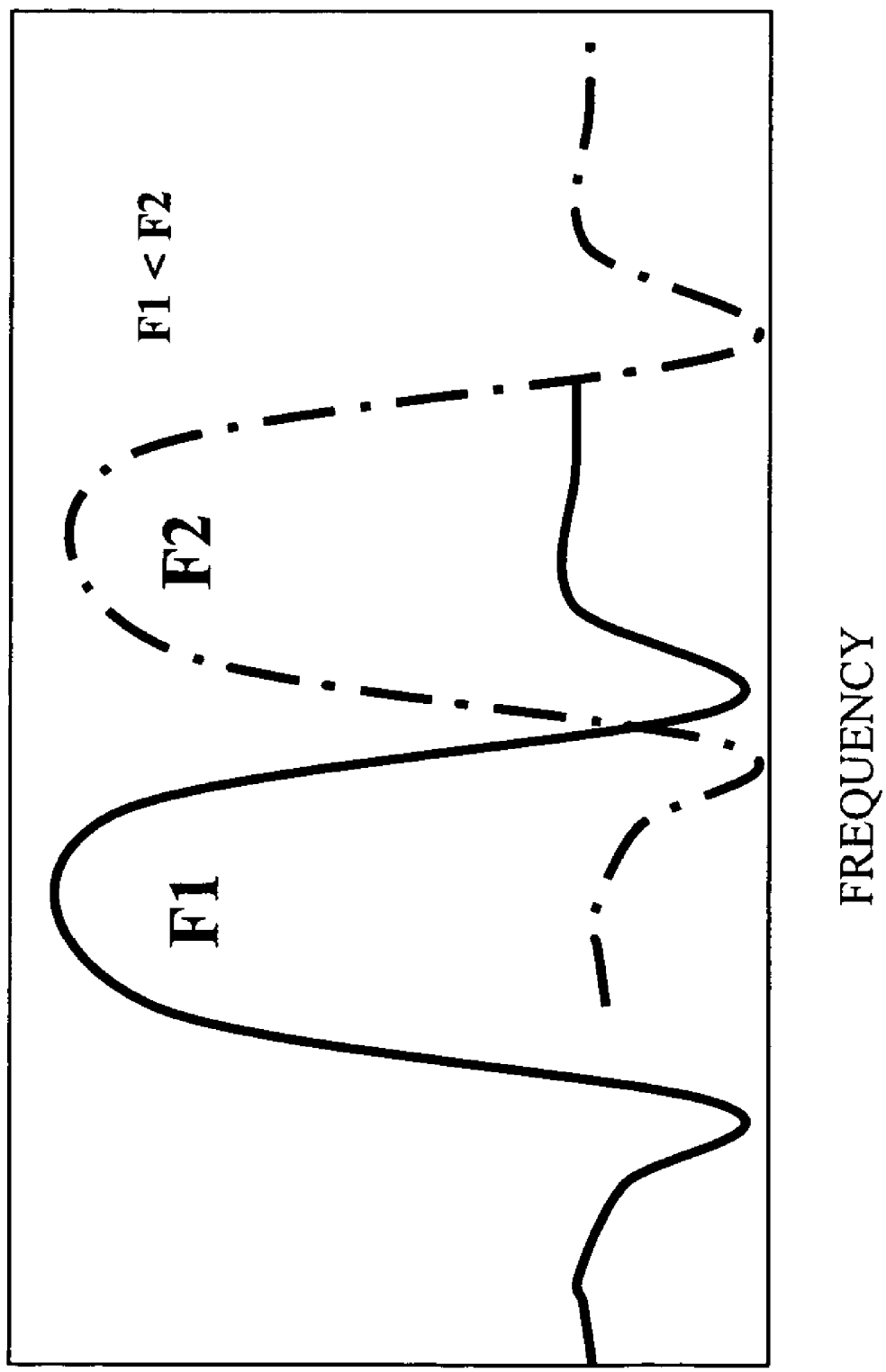
FIG. 2 is a graph of a frequency characteristic of the duplexer shown in FIG. 1.

A description will now be given, with reference to FIGS. 1 and 2, of the outline of a duplexer according to embodiments of the present invention. FIG. 1 schematically shows a circuit configuration of a duplexer, and FIG. 2 shows a frequency characteristic of the duplexer. In FIG. 2, the horizontal axis denotes the frequency that becomes higher as the position on the axis goes rightwards, and the vertical axis denotes the pass intensity that increases as the position on the axis goes upwards.

Referring to FIG. 1, a duplexer 100 has two filters 12 (F1) and 13 (F2), a phase matching circuit 11, a common terminal 14, a transmit terminal 15 and a receive terminal 16. The common terminal 14 is used to make a connection with an external circuit that receives and transmits waves via an antenna. The external circuit may be a transmission cable. The transmit terminal 15 is used to make a connection with a transmitter arranged outside of the duplexer 100. A transmit signal from the transmitter having a desired center frequency is applied to the duplexer 100 via the transmit circuit 15. The receive terminal 16 is used to make a connection with a receiver arranged outside of the duplexer 100. A received signal having a desired center frequency is applied to the receiver from the duplexer 100 via the receive terminal 16. The filters 12 and 13 and the phase matching circuit 11 are housed in a multilayer ceramic package. The filters 12 and 13 are respective SAW filters having different center frequencies F1 and F2 of the pass bands. For example, the filter 12 is a transmit filter and the filter 13 is a receive filter. In this case, the center frequency F2 of the receive filter is higher the center frequency F1 of the transmit filter. The 1.9 GHz-band duplexer has only a frequency difference of about 100 MHz between F1 and F2.

The phase matching circuit 11 is provided to restrain interference between the filters 12 and 13. It is now assumed that Z1 denotes the characteristic impedance obtained by viewing the filter 12 from the common terminal 14, and Z2 denotes the characteristic impedance obtained by viewing the filter 13 from the common terminal 14. Due to the function of the phase matching circuit 11, when the signal input from the common terminal 14 has the frequency F1, the characteristic impedance Z1 on the side of the filter 12 is equal to the characteristic impedance of the common terminal 14, while the characteristic impedance on the side of the filter 13 is infinite and the reflection coefficient is equal to 1. When the signal input from the common terminal 14 has the frequency F2, the characteristic impedance Z2 on the side of the filter 13 is equal to the characteristic impedance of the common terminal 14, while the characteristic impedance on the side of the filter 12 is infinite and the reflection coefficient is equal to 1.

First Embodiment

FIG. 3 is a vertical sectional view of the duplexer 100 according to a first embodiment of the present invention. FIG. 4 is a plan view of the duplexer shown in FIG. 3, and shows a package from which a cap has been removed.

Referring to FIG. 3, the duplexer 100 has a laminate package 120, a cap 28, a filter chip 29, and a phase matching line pattern 32.

The laminate package 120 has a multilayer structure composed of six layers 121-126. The layer 121 is a cap mounting layer. The layer 122 is a wire bonding pad layer. The layer 123 is a cavity layer. The layer 124 is a die-attached layer. The layer 125 is a phase matching line layer. The layer 126 is a common ground/footpad layer.

The layers 121 through 126 of the laminate package 120 may be made of alumina ceramics or glass ceramics having a dielectric constant ($\in$) of approximately 9.5. The filter chip 29 has a substrate that may be a piezoelectric single crystal, for example, 42° Y-cut X-propagation $LiTaO_3$. Electrodes and patterns on the piezoelectric crystal are made of an electrically conductive material. For example, a metal or alloy layer or a laminate of alloy layers are formed on the piezoelectric substrate by sputtering and are photolithographically exposed and etched. The alloy may contain Al as the main composition such as Al—Cu or Al—Mg. The laminate may be Al—Cu/Cu//Al—Cu, Al/Cu/Al, Al/Mg/Al, Al—Mg/Mg/Al—Mg.

For example, the laminate package 120 has a size of 5 mm×5 mm×1.5 mm or 3.8 mm×3.8 mm×1.4 mm where 1.5 mm or 1.4 mm is the height (thickness) of the package.

The cap mounting layer 121, the wire bonding pad layer 122 and the cavity layer 123 form a stepwise portion in the package 120. A space defined by the stepwise portion defines a cavity that houses the filter chip 29. The chip 29 may be a single chip or may be divided into multiple chips (for example, two filter chips). For the single chip, the transmit and receive filters are formed thereon. For the two chips, the transmit filter is formed on one of the two chips, and the receive filter is mounted on the other. The following description is directed to the duplexer 100 with the single chip 29.

Phase matching line patterns related to at least one of transmit and receive circuits that will be described later are provided on the wire bonding pad layer 122 and the cavity layer 123. The die-attached layer 124 provides a surface on which the chip 29 is mounted. Another phase matching line pattern is provided on the phase matching line pattern layer 125. More particularly, this phase matching line pattern is a strip pattern, which may be, for example, 80 to 120 μm side.

The strip line is formed between a metal ground on the cap mounting layer 121 and a ground pattern provided within the laminate package 120 or between a ground pattern on the die-attached layer 124 and the ground pattern within the package 120. The phase matching line pattern 32 is made of a metal that contains, as the major component, copper (Cu), silver (Ag) or tungsten (W). The phase matching line pattern 32 may be formed by depositing a conductive film on the layer 125 and pattering it by screen print.

The common ground/footpad layer 126 is the lowermost layer of the laminate package 120. Footpads 27 serve as terminals for making external connections, and correspond to the common terminal 14, the transmit terminal 15 and the receive terminal 16. The cap 28 hermetically seals the chip 29, and contains a metal material such as Au or Ni plating.

The chip 29 has a ladder type SAW filter composed of one-port SAW resonators arranged in a ladder fashion, and a dual mode SAW (DMS) filter. The ladder type SAW filter may be the transmit filter, and the DMS filter may be the receive filter. The chip 29 is fixed to a die-attached part 30 on the die-attached layer 124 by an electrically conductive adhesive 31.

As shown in FIG. 4, the laminate package 120 has grooves 43 on the side surfaces, each of which grooves has a half-cycle cross section. Each of the four side surfaces of the laminate package 120 has three grooves 43. The grooves 43 run from the cap mounting layer 121 to the common ground/footpad layer 126. A conductive layer is provided to each groove 43, so that a connection path (side castellation) can be defined. The connection paths 43 make interlayer connections and serve as terminals for making external connections. As shown in FIG. 4, reference numerals $35_1$-$35_{12}$ indicate 12 connection paths (side castellations) 35.

As shown in FIG. 4, the chip 29, the cap mounting layer 121 and a part of the wire bonding pad layer 122 appear due to removal of the cap 128. A seal ring 34 containing Cu plated with Ni and Au is formed on the cap mounting layer 121. The cap 28 is mounted on the seal ring 34. The cap mounting layer 121 has a window 33 located at the center thereof. The window 33 defines the cavity that houses the filter chip 29. The seal ring 34 is connected to the connection paths 35 except the four connection paths $35_3$, $35_6$, $35_9$ and $35_{12}$ at the middle positions on the side surfaces of the package 120.

Multiple blocks indicated by a reference numeral 37 schematically show the resonators of the ladder type SAW filter (patterns of electrodes and reflectors), and multiple blocks indicated by a reference numeral 38 schematically show the resonators of the DMS filter (patterns of electrodes and reflectors). These resonators are mutually connected by wiring patterns formed on the filter chip 29, and are connected to wire bonding pads 39 formed thereon.

The wire bonding pads 39 are connected to wire bonding pads 40 formed on the wire bonding pad layer 122 by means of bonding wires 41. The bonding wires 41 may be Al—Si wires.

FIGS. 5A through 5G show the layers of the laminate package 120 of the duplexer 100. More particularly, FIG. 5A shows the cap mounting layer 121, and FIG. 5B shows the wire bonding pad layer 122. FIG. 5C shows the cavity layer 123, and FIG. 5D shows the die-attached layer 124. FIG. 5E shows the phase matching line pattern layer 125. FIG. 5F shows the upper surface of the common ground/footpad layer 126, and FIG. 5G shows the bottom surface thereof.

FIGS. 6A, 6B and 6C show phase matching line patterns provided between the SAW filter and the receive terminal 16. More particularly, FIG. 6A shows the wire bonding pad layer 122, and FIG. 6B shows the cavity layer 123. FIG. 6C shows the wire bonding pad layer 122 and the cavity layers 123 in overwriting fashion. As shown in FIG. 5A, the cap mounting layer 121 has the window 33 (see FIG. 4) at the center thereof. Due to removal of the cap 28, the window 33 appears. The seal ring 34 is provided on the cap mounting layer 121.

AS shown in FIG. 5B, the wire bonding pad layer 122 has a window 44 located at the center thereof. The window 44 is smaller than the window 34 of the cap mounting layer 121. Multiple wire bonding pads 40 are arranged along opposing edges of the window 44 (see FIG. 4). Wiring patterns are connected to the wire bonding pads 40.

Signal line patterns are indicated by reference numerals $60_3$, $60_5$ and $60_8$, and ground line patterns are indicated by reference numerals $60_1$, $60_2$, $60_4$, $60_6$, $60_7$ and $60_9$. A description will now be given of the relation between the connection paths 35 and the chip 29 with reference to FIGS. 4 and 5A through 5G. The connection path $35_2$ forms the ground of the first stage of the DMS filter. The connection path $35_3$ makes a connection with the foot castellation of the transmit terminal 15 (the foot castellation is formed by a footpad that will be described later). The connection path $35_4$ forms the ground of the latter type SAW filter.

The connection path $35_5$ forms the first-stage ground of the DMS filter or the ground of the ladder type SAW filter. The connection path $35_6$ makes a connection with the foot castellation of the common terminal (antenna terminal) 14. The connection path $35_8$ forms the ground of the second stage of the DMS filter. The connection path $35_9$ makes a connection with the foot castellation of the receive terminal 16. The connection paths $35_{10}$ and $35_{11}$ form the ground of the second stage of the DMS filter. The connection path $35_{12}$ is not connected to any patterns on the wire bonding pad layer 122.

The connection paths or conductive paths $35_1$ to $35_{12}$ having the above functions are connected to wire bonding pads 40 via extraction electrodes. Among the wire bonding pads 40, the wire bonding pad $40_1$ is used to make a connection with the input end (one end) of the phase matching line pattern 32, and the wire bonding pad $40_2$ is used to make a connection with the output end (the other end) thereof. The pads $40_1$ and $40_2$ are connected to the input and output ends of the phase matching line pattern 32 formed on the phase matching line pattern layer 125 by means of vias $46_1$ and $46_8$.

A reference numeral $60_3$ indicates a signal line pattern, which is used as a phase matching line pattern. The phase matching line pattern $60_3$ forms a part of a line pattern that is provided between the SAW filter 13 and the receive terminal 16 and runs on at least two layers of the laminate package 120 within the range defined by peripheral ground patterns. The peripheral ground patterns mentioned above are the ground line patterns $60_2$ and $60_4$. The signal line $60_3$ has a curved portion.

A phase matching line pattern $61_1$ is formed on the cavity layer 123 and is connected to the phase matching line pattern $60_3$ formed on the wire bonding pad layer 122 by a via $46_9$. Thus, the phase matching line pattern $61_1$ forms another part of the line pattern that is provided between the SAW filter 13 and the receive terminal 16 and runs on at least two layers of the laminate package 120 within the range defined by the peripheral ground patterns. The signal line $61_1$ has a curved portion.

As shown in FIG. 6C, the line patterns $60_3$ and $61_1$ include portions that cross each other, more specifically, the portions being substantially orthogonal to each other. Further, the line patterns $60_3$ and $61_1$ are arranged so as not to overlap with each other in parallel except the via $46_9$.

As shown in FIG. 5C, the die-attached part 30 that forms a ground pattern is defined on the die-attached layer 124. Four thick-coating block lands that contact the chip 29 are provided in the die-attached part 30. The four block lands may be formed by doing thick coating at the time of forming the die-attached part 30. As shown in FIG. 3, the conductive adhesive 31 is used to attach the chip 29 to the block lands in the die-attached part 30. The four blocks cause the conductive adhesive 31 to go around the entire bottom surface of the chip 29. The die-attached part 30 is connected to the ground connection paths 35 via extraction patterns $47_1$ through $47_6$.

The die-attached layer 124 is provided on the phase matching line pattern layer 125 shown in FIG. 5D. As shown in this figure, the phase matching line pattern 32 is formed on the phase matching line pattern layer 125. The line pattern 32 is bent at multiple points in order to secure a given length.

The phase matching line pattern 32 may be made of an electrically conductive material that contains, as the major component, copper (Cu), silver (Ag) or tungsten (W). The patterns located above and below the phase matching line pattern 32 and set at the ground potential (more specifically, the die-attached part 30 shown in FIG. 5D and a ground pattern 36 shown in FIG. 5F) serve as the grounds of the strip line. The phase matching line pattern 32 thus structured has little production difference and realizes reliable filter characteristics.

The common ground/footpad layer 126 underlies the phase matching line pattern 125. FIG. 5F shows the upper surface of the layer 126, and FIG. 5G is a view of the lower (bottom) surface seeing through the layer 126. The common ground pattern 36 is provided on the upper surface of the layer 126.

The common ground pattern 36 is formed on almost the entire upper surface. The common ground pattern 36 is connected to the connection paths except the signal connection paths $35_3$, $35_6$ and $35_9$. Thus, the ground is functionally strengthened to reduce the inductance and improve the stop-band characteristics.

The bottom surface of the common ground/footpad layer 126 is the mount surface of the duplexer 100. The duplexer 100 is mounted on a circuit board so that the mount surface faces the circuit board. As shown in FIG. 5G, footpads (foot castellations) $27_1$ through $27_{12}$ respectively connected to the connection paths $35_1$ through $35_{12}$ are formed on the mount surface of the duplexer 100. The footpads $27_1$ through $27_{12}$ serve as external connection terminals, which are electrically connectable to electrodes on the circuit board.

The footpads $27_1$ and $27_2$ are the ground terminal of the first stage of the DMS filter. The footpad $27_3$ is the transmit terminal 15 of the duplexer 100. The footpad $27_4$ are the ground terminal of the ladder type SAW filter. The footpad $27_5$ is the first-stage ground of the DMS filter or the ground of the ladder type SAW filter. The footpad $27_6$ is the common terminal 14, to which an antenna can be connected.

The footpads $27_7$ and $27_8$ serve as the ground terminals of the second stage of the DMS filter. The footpad $27_9$ is the receive terminal 16. The footpads $27_{10}$ and $27_{11}$ is the ground terminals of the second stage of the DMS filter. The footpad $27_{12}$ is the ground terminal connected to the common ground pattern. In FIG. 3, these footpads are simply indicated as footpads 27.

The footpad $27_9$ serving as the receive terminal 16 is connected to the phase matching line pattern $61_1$ on the cavity layer 123 by the connection path $35_9$, and is connected to the phase matching line pattern $60_3$ on the wire bonding pad layer 122 by the via $46_9$, so that a connection with the filter can be made. The footpad $27_3$ serving as the transmit terminal 15 is connected to the filter 12 via the connection path $35_3$ and the transmit signal pattern $60_8$ on the wire bonding pad layer 122.

The footpad $27_6$ serving as the common terminal 14 is connected to one end of the phase matching line pattern 32 on the phase matching line pattern layer 125 via the connection path $35_6$, the signal pattern $60_5$ on the wire bonding layer 122 and the via $46_1$. The other end of the phase matching line pattern 32 is connected to the chip 29 via the pad $40_2$ on the wire bonding pad layer 122.

The ground pattern formed by the die-attached part 30 shown in FIG. 5D and the common ground pattern 36 shown in FIG. 5F are provided so that the phase matching line pattern 32 is sandwiched therebetween from above and below. With this structure, it is possible to improve impedance matching and insertion loss.

The ground pattern on the die-attached layer 124 is connected to the connection paths $35_2$, $35_4$, $35_5$, $35_8$, $35_{11}$ and $35_{12}$ via extraction patterns $47_1$-$47_6$ on the die-attached part 30. The die-attached part 30 and the extraction patterns 47 are connected to vias $46_2$, $46_6$, $46_{10}$-$46_{13}$. The vias 46 pass through the phase matching line pattern layer 25 and are connected to the common ground pattern 36.

The ground pattern 30 formed by the die-attached part 30 of the die-attached layer 124 is connected to the common ground pattern 46 via the multiple vias 46, so that the ground below the chip 29 can be further strengthened functionally. The common ground pattern 36 is uniformly provided on almost the entire surface, and is connected to multiple external connection terminals via the connection path $35_2$ and so on, so that the ground on the bottom of the chip 29 can be functionally strengthened.

FIG. 7 shows an electrically equivalent model of the duplexer 100 according to the first embodiment of the present invention. The duplexer 100 has the transmit filter 12, the receive filter 13, the common terminal 14, the transmit terminal 15, the receive terminal 16, the phase matching line 32 (which corresponds to the phase matching circuit 11), and the phase matching lines 603 and 611.

As shown in FIGS. 6B, 6C and 7, the phase matching line between the SAW filter 13 and the receive terminal 16 is composed of the phase matching lines 60 and $61_1$ that are provided between the SAW filter 13 and the receive terminal 16 and run on at least two layers of the laminate package 120 within the range defined by the peripheral ground patterns. Thus, the phase matching line between the SAW filter 13 and the receive terminal 16 is sufficiently long, so that a large phase rotating angle can be obtained and insertion loss can be improved due to improved matching in the pass band. This will be described below with reference to FIGS. 8A and 8B.

Figure 8A:
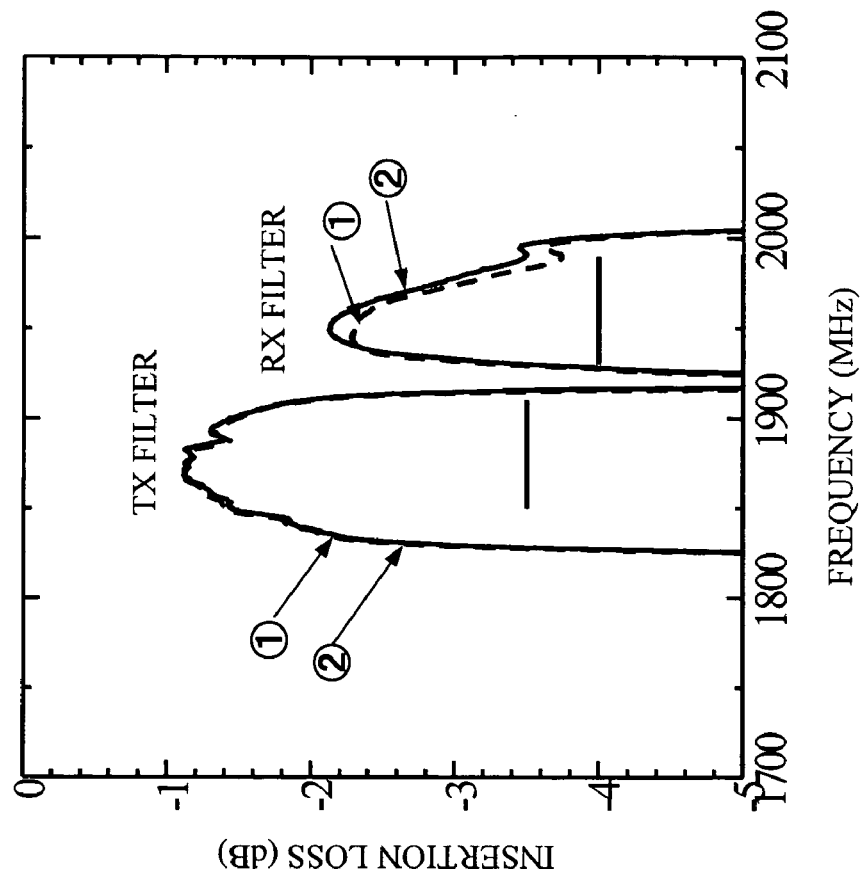
FIG. 8A is a graph of a reflection characteristic of a receive port of the duplexer according to the first embodiment of the present invention.
Figure 8B:
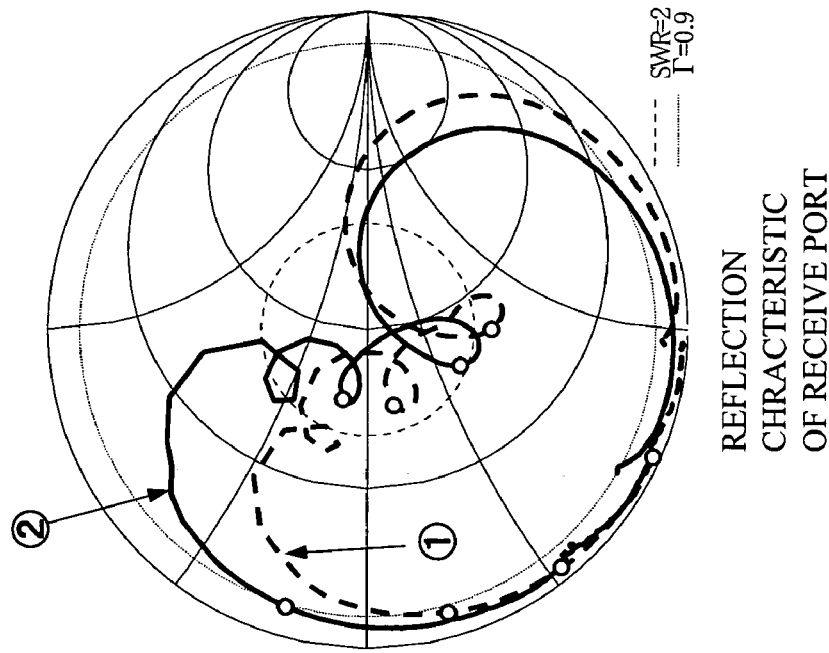
FIG. 8B is an enlarged view of a pass-band characteristic.

FIG. 8A shows a reflection characteristic at the receive port of the duplexer 100 according to the first embodiment, and FIG. 8B is an enlarged view of the pass-band characteristic of the duplexer 100. In FIG. 8B, the horizontal axis denotes frequency, and the vertical axis denotes insertion loss. It can be seen from FIGS. 8A and 8B that the phase rotation angle of the duplexer is larger than that of the conventional duplexer, and the insertion loss is smaller than that of the conventional duplexer.

In short, according to the present invention, the receive circuit between the receive footpad and the receive filter includes phase matching line patterns that run on at least two layers of the package 100. Thus, the phase rotating angle and insertion loss can be improved.

Further, the signal line patterns located at different layers are arranged so as not to overlap each other in parallel. This restrains the interference between the signal lines, and realizes signal lines with restrained variation in characteristic impedance. As a result, reflection on the lines can be restrained, so that insertion loss can be improved.

Second Embodiment

Figure 9B:
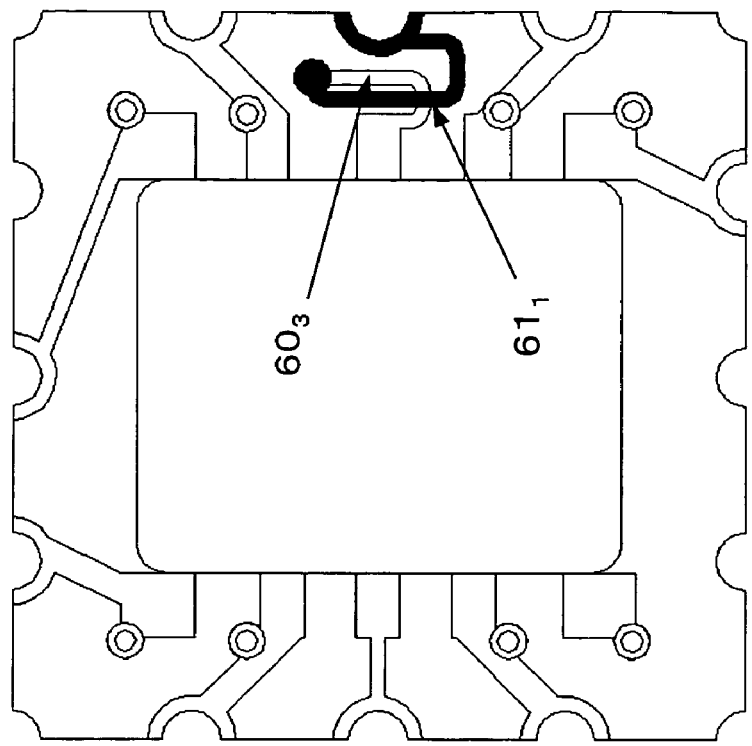
FIGS. 9A and 9B show layers of a duplexer according to a second embodiment of the present invention.
Figure 9A:
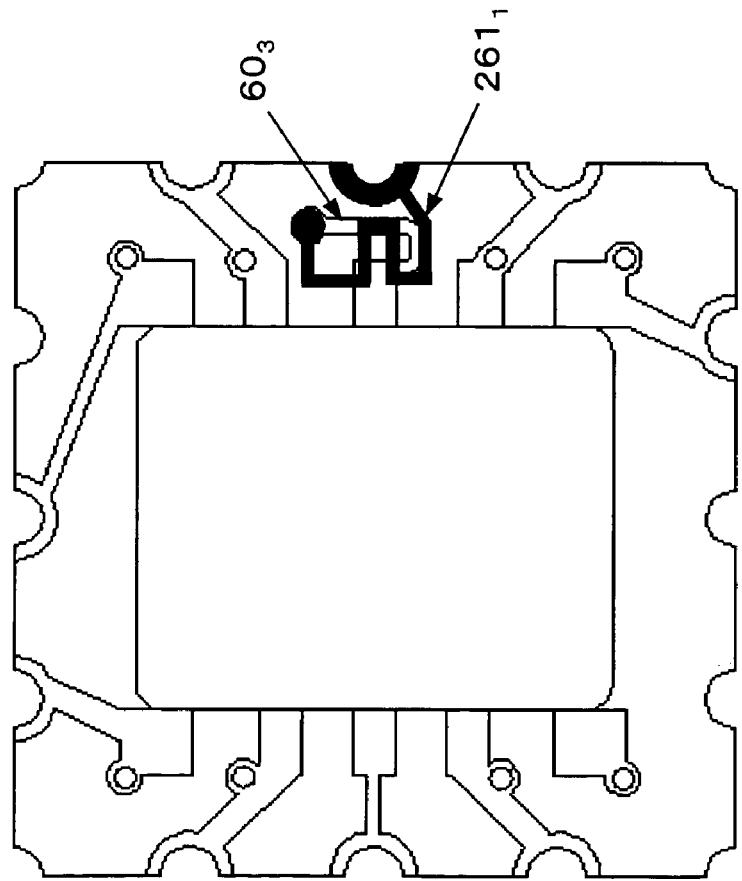

FIGS. 9A and 9B show a duplexer 200 according to a second embodiment of the present invention. More particularly, FIG. 9A shows the bonding pad layer 122 and a cavity layer 223 in overlapping fashion, and FIG. 9B shows the wire bonding pad layer 122 and the cavity layer 123 of the first embodiment in overlapping fashion. The second embodiment differs from the first embodiment in which a phase matching line pattern $26_1$ is substituted for the phase matching line pattern $61_1$.

FIG. 9A shows a case where the phase matching line between the SAW filter 13 and the receive terminal 16 is set equal to 78Ω, while FIG. 9B shows a case where the corresponding phase matching line is set equal to 61Ω.

Figure 10B:
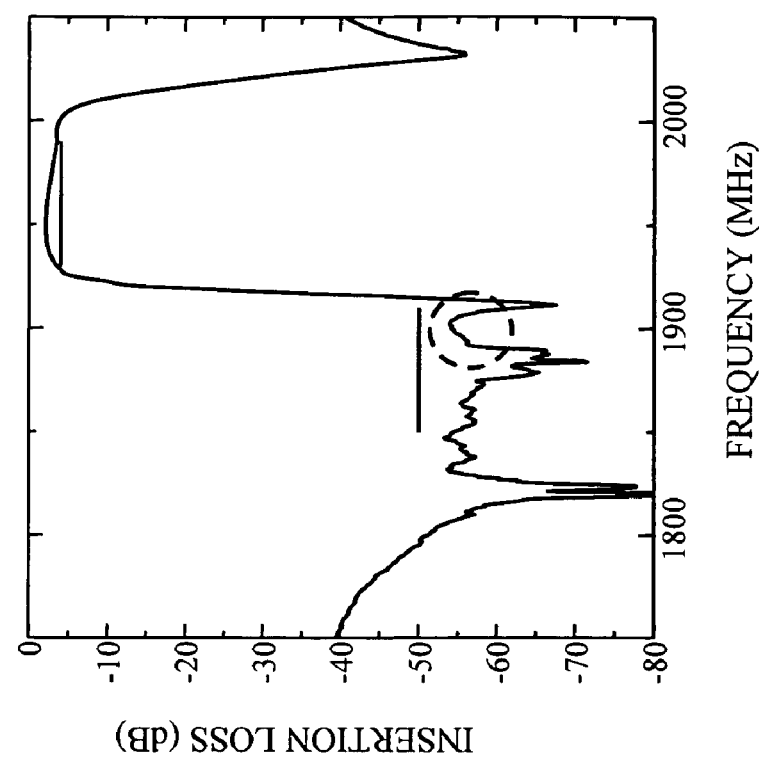
FIG. 10B is a graph of a filter characteristic of the receive system of the duplexer according to the first embodiment of the present invention.
Figure 10A:
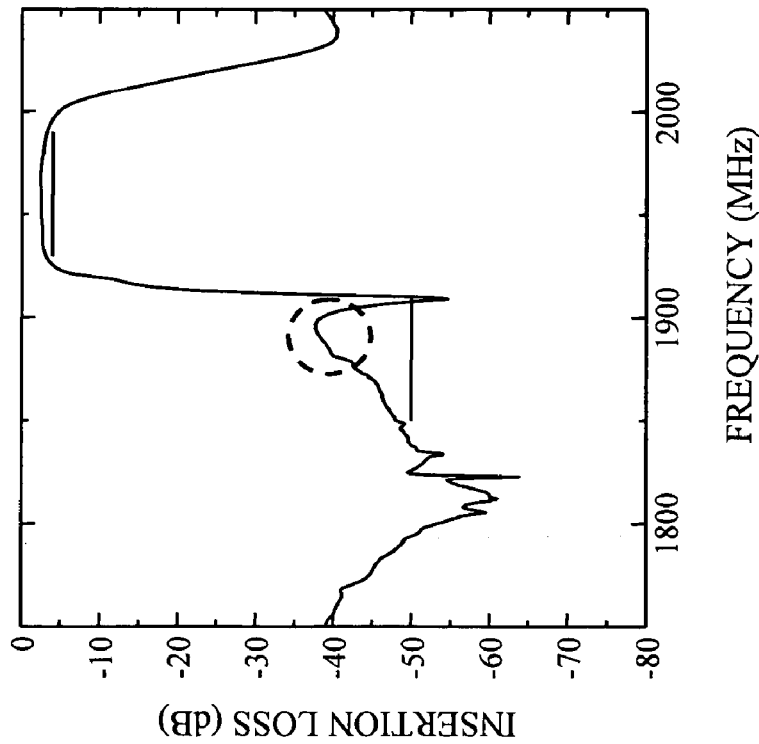
FIG. 10A is a graph of a filter characteristic of the receive system of the duplexer according to the second embodiment of the present invention.

FIG. 10A shows a filter characteristic of the receive system of the duplexer 200 according to the second embodiment, and FIG. 10B is a filter characteristic of the duplexer 100 according to the first embodiment. As shown in FIG. 10A, the duplexer 200 has a larger insertion loss on the lower side than that of the duplexer 100. This is because the phase matching line $26_1$ shown in FIG. 9 has a portion that overlaps with the underlying phase matching line pattern $60_3$ in parallel other than the via and increases the interference between the line patterns.

Third Embodiment

FIGS. 11A through 11G respectively show layers of a laminate package employed in a duplexer 300 according to a third embodiment of the present invention. More particularly, FIG. 11A shows the cap mounting layer 121, and FIG. 11B shows the wire bonding pad layer 122. FIG. 11C shows the cavity layer 123, and FIG. 11D shows the die-attached layer 124. FIG. 11E shows the phase matching line pattern layer 125. FIG. 11F shows the upper surface of a common ground/footpad layer 326, and FIG. 11G shows the lower surface thereof. In these figures, parts that are the same as those shown in the previously described figures are given the same reference numerals.

The third embodiment differs from the first embodiment in which the former employs the common ground/footpad layer 326. The layers shown in FIGS. 11A through 11E are the same as those shown in FIGS. 5A through 5E. As shown in FIG. 11F, a common ground pattern 336 is formed on the upper surface of the common ground/footpad layer 326. This pattern 336 is formed on almost the entire upper surface except an area located below the phase matching line patterns $60_3$ and $61_1$ shown in FIGS. 11B and 11C. That is, the common ground pattern 136 is not provided in area X below the phase matching line patterns $60_3$ and $61_1$.

The phase matching line patterns $60_3$ and $61_1$ do not overlap the ground pattern at the layers except the seal ring 34 and the die-attached layer 124, so that a large impedance is available and the pass band can be shifted toward the high-impedance side. This improves impedance matching and insertion loss.

The above arrangement may be modified so that the phase matching line patterns $60_3$ and $61_1$ overlap with only the seal ring 34.

Fourth Embodiment

FIGS. 12A through 12G respectively show layers of a laminate package employed in a duplexer 400 according to a fourth embodiment of the present invention. More particularly, FIG. 12A shows the cap mounting layer 121, and FIG. 12B shows the wire bonding pad layer 122. FIG. 12C shows the cavity layer 123, and FIG. 12D shows a die-attached layer 424. FIG. 11E shows the phase matching line pattern layer 125. FIG. 12F shows the upper surface of the common ground/footpad layer 326, and FIG. 11G shows the lower surface thereof. In these figures, parts that are the same as those shown in the previously described figures are given the same reference numerals.

The die-attached layer 424 employed in the fourth embodiment differs from the aforementioned die-attached layers. The layers shown in FIGS. 12A through 12C and 12E through 12G are the same as those shown in FIGS. 11A through 11C and 11E through 11G. As shown in FIG. 12G, a ground pattern 431 for use in impedance control is provided next to the die-attached part 30. The ground pattern 431 is located below the phase matching line patterns $60_3$ and $61_1$ shown in FIGS. 12B and 12C.

Like the third embodiment, the common ground pattern 336 is formed on the upper surface of the common ground/footpad layer 326 shown in FIG. 12F. The common ground pattern 336 is provided on almost the entire upper surface of the common ground/footpad layer 326 except the area X located below the phase matching line patterns $60_3$ and $61_1$ shown in FIGS. 12B and 12C.

The phase matching line patterns $60_3$ and $61_1$ may have increased impedance by arranging these lines so as not to overlap the ground patterns except the seal ring 34. Arranging the ground patterns taking the matching condition of the filter into consideration can control the impedance of the phase line matching patterns.

The transmit footpad $26_3$ or the receive footpad $26_9$ is provided on the bottom of the common ground/footpad layer 326, as shown in FIG. 12G. As shown in FIG. 12F, the ground pattern 336 is provided on the upper surface of the common ground/footpad layer 326 so as not to overlap the transmit footpad $26_3$ and the receive footpad $26_9$. With the above arrangement, it is possible to remove the capacitance between the transmit circuit and ground and the capacitance between the receive circuit and ground and to improve insertion loss because of improvement in matching in the pass band.

The ground pattern 336 on the upper surface of the footpad 326 is provided to stabilize the characteristic impedance of the phase matching line 32. It has been confirmed that the characteristic impedance of the phase matching line 32 is not affected by removal of a portion of the ground pattern 336 that overlaps the phase matching line 32.

The capacitance will further be reduced by arranging the transmit footpad $26_3$ and the receive footpad $26_9$ so as not to overlap the ground patterns except the seal ring 34 and the wire bonding pad layer 122. The filter characteristic is improved when the capacitance between the transmit circuit and ground or the capacitance between the receive circuit and ground is equal to or less than 0.7 pF.

Figure 14B:
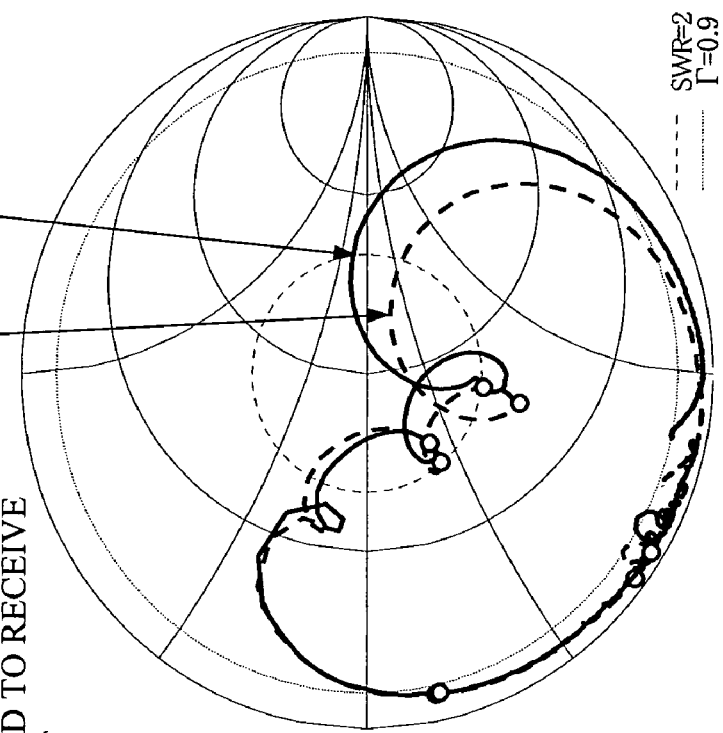
FIG. 14B is a reflection characteristic of the receive port of the duplexer according to the fourth embodiment of the present invention.
Figure 14A:
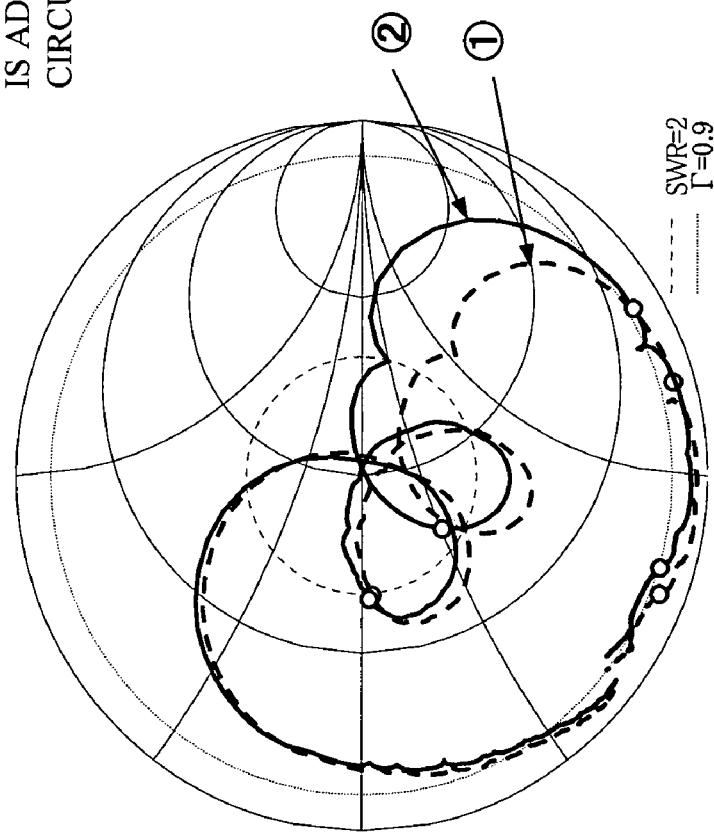
FIG. 14A is a reflection characteristic of the transmit port of the duplexer according to the fourth embodiment of the present invention.

FIG. 13 is a graph of a filter characteristic of the duplexer according to the fourth embodiment of the present invention. FIG. 14A shows a reflection characteristic of the transmit port, and FIG. 14B shows a reflection characteristic of the receive port. In FIG. 13, the horizontal axis denotes frequency, and the vertical axis denotes insertion loss. The broken lines in these figures are characteristics of the conventional duplexer, and the solid lines are characteristics of the duplexer according to the fourth embodiment of the present invention. It can be seen from FIG. 13 that the insertion loss is improved on both the transmit and receive sides. As shown in FIGS. 14A and 14B, the capacitances at the transmit and receive ports are reduced so that impedance matching can be improved.

Fifth Embodiment

Figure 16B:
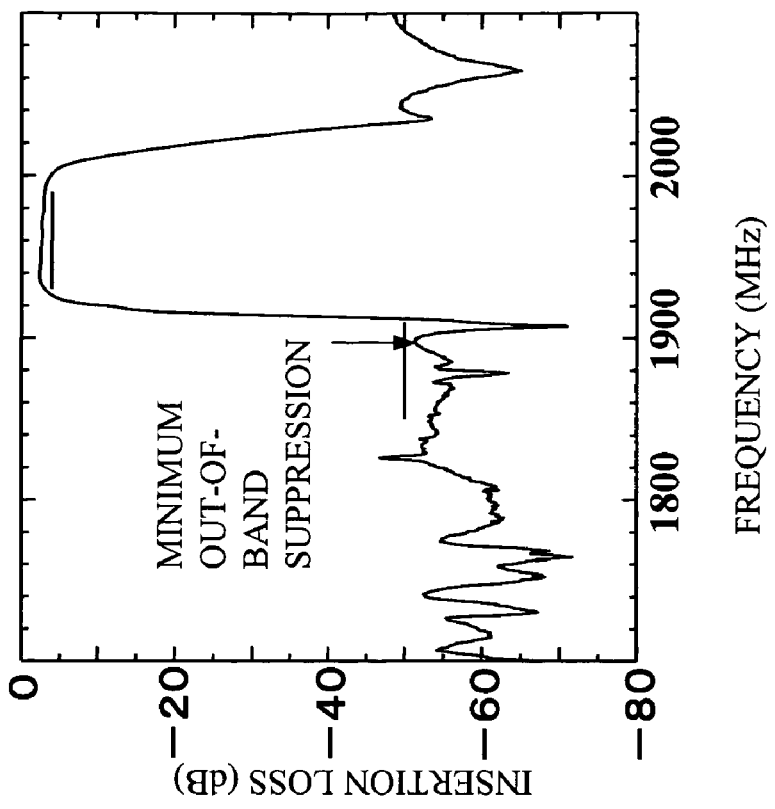
FIG. 16B is a graph describing a minimum out-of-band suppression in the fifth embodiment of the present invention.
Figure 16A:
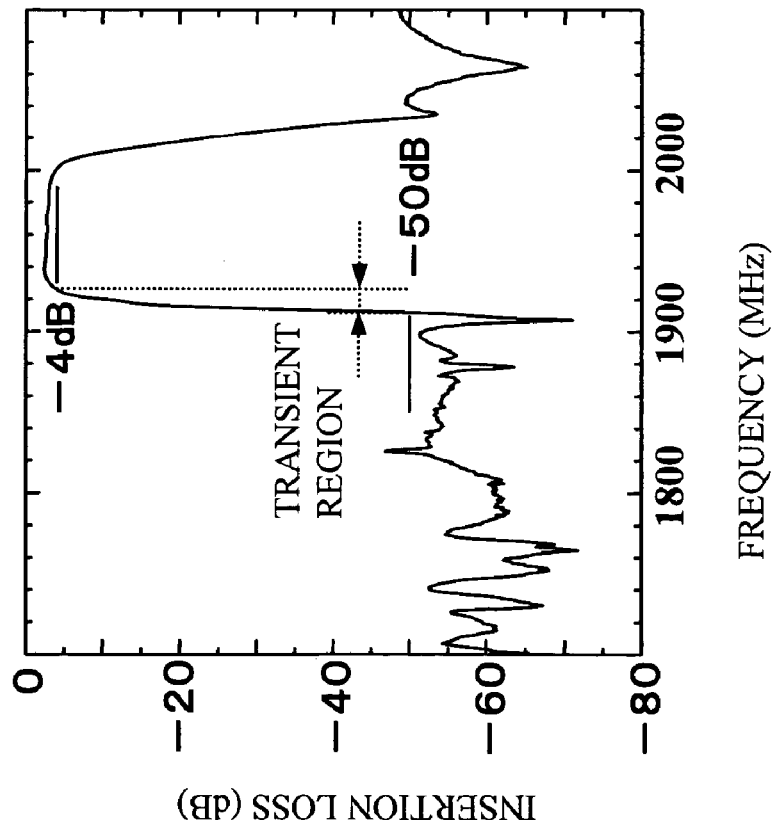
FIG. 16A is a graph describing a transition region in a fifth embodiment of the present invention.
Figure 17A:
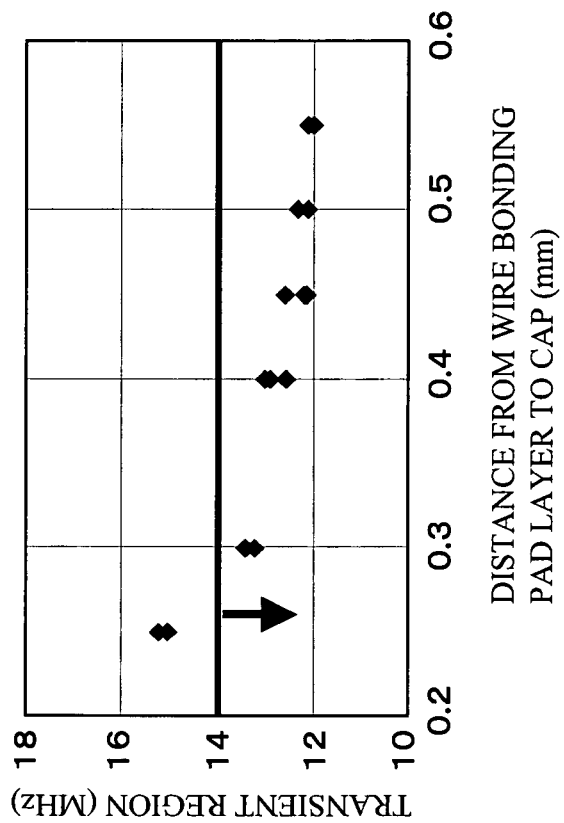
FIG. 17A shows transition regions as a function of the distance between a wire bonding pad layer and a cap of a duplexer according to the fifth embodiment of the present invention.
Figure 17B:
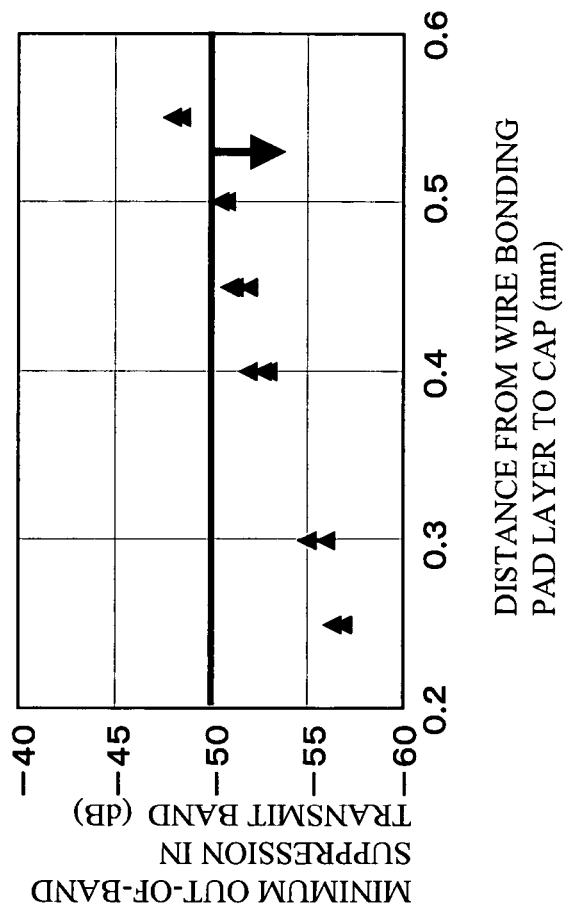
FIG. 17B shows minimum out-of-band suppression levels as a function of the distance between the wire bonding pad layer and the cap of the duplexer according to the fifth embodiment of the present invention.

FIG. 15 is a vertical sectional view of a duplexer 500 according to a fifth embodiment of the present invention. FIG. 16A shows a transition region in the frequency characteristic of the duplexer 500, and FIG. 16B shows the minimum out-of-band (stop band) suppression level. FIG. 17A shows a transition region from the wire bonding pad layer to the cap, and FIG. 17B shows the minimum out-of-band suppression level as a function of the distance from the wire bonding pad layer to the cap. In FIGS. 17A and 17B, the horizontal axis denotes frequency, and the vertical axis denotes attenuation. In FIG. 15, parts that are the same as those shown in the previously described figures are given the same reference numerals.

As shown in FIG. 16A, the transition range is defined as the frequency width (MHz) between the frequency for an insertion loss of −4 dB and the frequency of an out-of-band suppression of −50 dB. The smaller the value of the transition region, the better the shape factor.

It is to be particularly noted that the transmit band and the receive band are very close to each other in the 1900 MHz filter. It is thus desired to provide a filter with a sharp filter characteristic that has a narrow transition range. The narrow transition range increases the tolerance for frequency deviations introduced in the production process and greatly improves the yield. Insertion loss can be particularly improved when the distance between the wire bonding pad layer 122 and the cap 28 is 0.3~0.5 mm.

FIG. 17A shows the transition range (MHz) of the fifth embodiment. More particularly, FIG. 17A shows the transition ranges of different samples in which the distances between the wire bonding pad layer 122 and the cap 28 are 0.25 mm, 0.3 mm, 0.4 mm, 0.45 mm, 0.5 mm and 0.55 mm. It can be seen from FIG. 17A that the transition range is equal to or less than 14 MHz when the distance ranges 0.3 to 0.55 mm.

FIG. 17B shows the minimum out-of-band suppression levels of the same samples as mentioned above in which the distances between the wire bonding pad layer 122 and the cap 28 are 0.25 mm, 0.3 mm, 0.4 mm, 0.45 mm, 0.5 mm and 0.55 mm. It can be seen from FIG. 17B that the minimum out-of-band suppression level is equal to at least −50 dB when the distance is equal to or smaller than 0.5 mm. As shown in FIGS. 16A, 16B, 17A and 17B, the filter characteristics, particularly, the transition range and the minimum out-of-band suppression depend on the distance between the wire bonding pad layer 122 and the cap 28.

This is because the distance between the wire bonding pad layer 122 and the cap 28 changes the inductances of the ground wires and thus changes the minimum out-of-band suppression level. Further, the distance changes the inductances of the signal line wires and the matching state in the pass band, so that the transition region is changed. Thus, preferably, the optimum distance between the wire bonding pad layer 122 and the cap 28 is 0.3 mm to 0.5 mm.

Sixth Embodiment

A sixth embodiment of the invention has the same structure as that of the first embodiment, and is therefore described with reference to FIGS. 5A through 5G. It is essentially desired that the chip mounting surface is the true ground. However, this has an inductance equal to the distance between the die-attached part 30 to the footpad ground 36. Thus, in order to reduce the inductance of the die-attached part 30, it is connected by the vias 46 and the external connection paths (castellations) 35 so that the inductance can be reduced.

More particularly, the transmit ground and the receive ground are connected by the die-attached part 30, which are connected to the footpad ground 36 by means of at least six vias 46 and at least six external connection paths 35, so that the out-of-band suppression can be improved.

Figure 18:
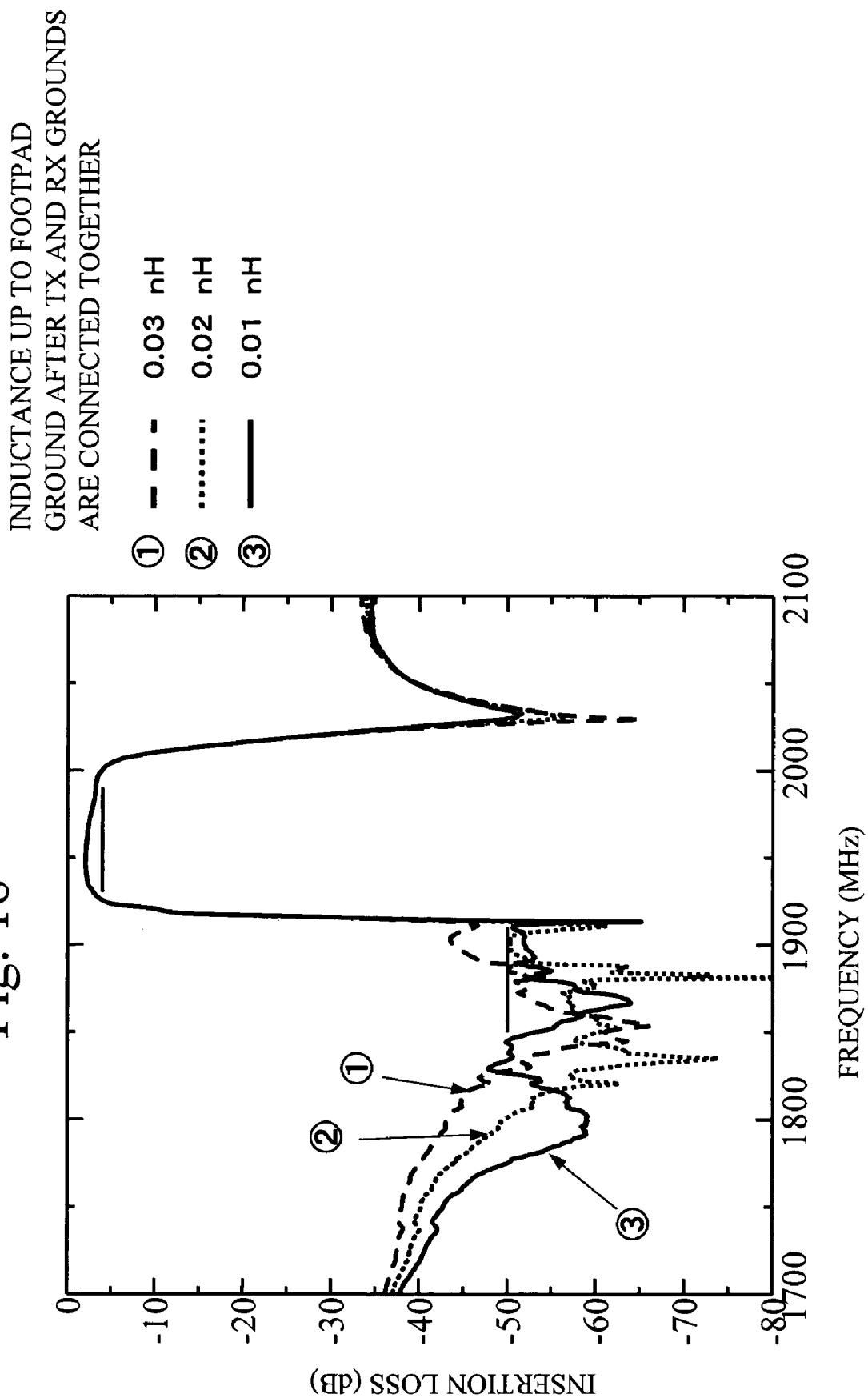
FIG. 18 is a graph of a filter characteristic of a duplexer according to a sixth embodiment of the present invention.

FIG. 18 shows a filter characteristic of the receive filter of the duplexer according to the sixth embodiment, in which the horizontal axis denotes frequency (MHz) and the vertical axis denotes insertion loss (dB).

In FIG. 18, circled numbers "1", "2" and "3" show filter characteristics when the inductance up to the footpad 36 after making the connection between the transmit and receive grounds is 0.03 nH, 0.02 nH and 0.01 nH, respectively. As shown in FIG. 18, the out-of-band suppression can be improved when the inductance up to the footpad 36 after making the connection between the transmit and receive grounds is set equal to or less than 0.02 nH.

Seventh Embodiment

Figure 19:
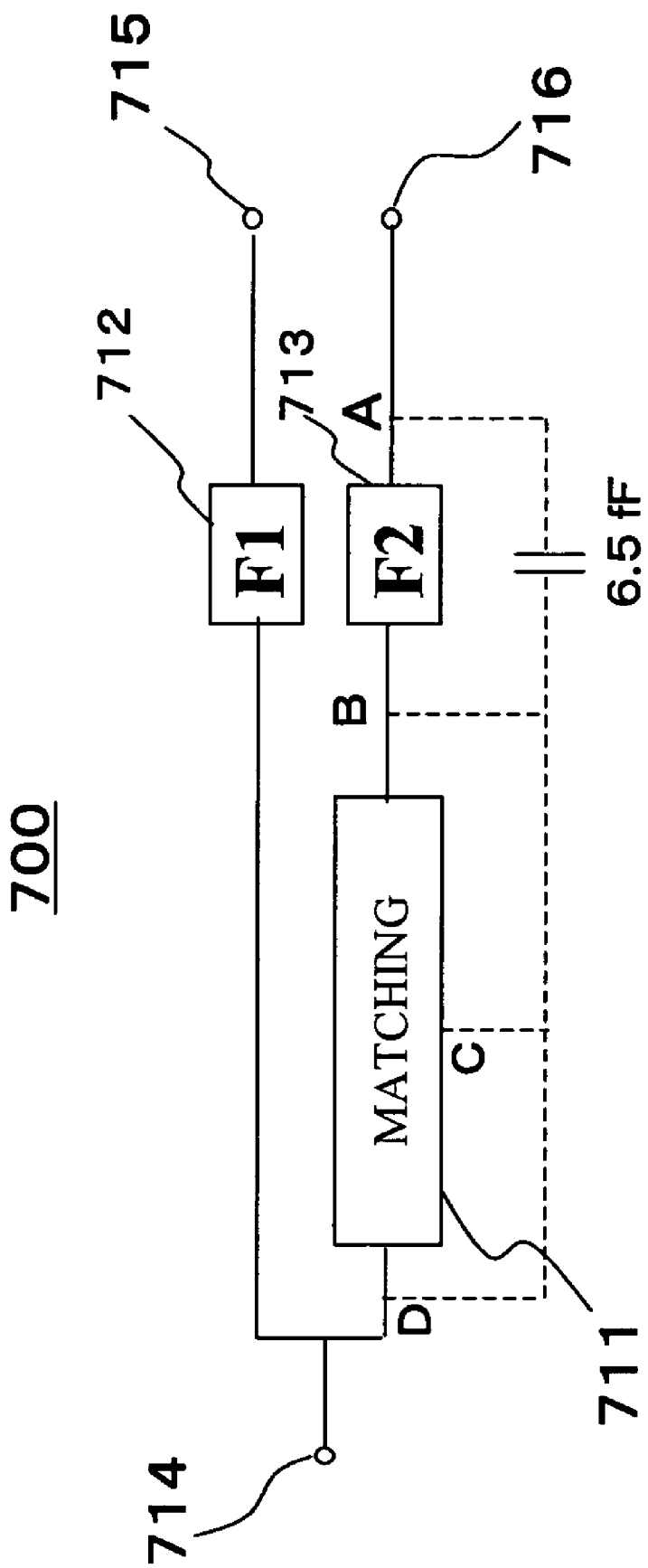
FIG. 19 is a circuit diagram of a duplexer according to a seventh embodiment of the present invention.

FIG. 19 shows a duplexer 700 according to a seventh embodiment of the present invention. FIG. 20 shows filter characteristics of the receive filter of the duplexer 700, in which the horizontal axis denotes frequency (MHz) and the vertical axis denotes insertion loss (dB). In FIG. 20, circled number "1" indicates a filter characteristic of the receive filter of the conventional duplexer. A circled number "2" indicates a filter characteristic of the receive filter of the duplexer 700 wherein a capacitance of 6.5 fF is added between nodes A and D shown in FIG. 19. A circled number "3" indicates a filter characteristic of the receive filter of the duplexer 700 wherein a capacitance of 6.5 fF is added between nodes A and C. A circled number "4" indicates a filter characteristic of the receive filter of the duplexer 700 wherein a capacitance of 6.5 fF is added between nodes A and B.

As shown in FIG. 19, the duplexer 700 has a phase matching circuit 711, a transmit filter 712, a receive filter 713, a common terminal 714, a transmit terminal 715 and a receive terminal 716. The phase matching circuit 711 is provided in the receive system. It can be seen from FIG. 20 that the insertion loss is degraded as indicated by circled number "4" when a capacitance of 6.5 fF is added between the nodes A and B, namely, between the receive footpad $27_9$ and the rear end of the matching circuit 711 (for example, the wire bonding pad $40_2$ shown in FIG. 5B).

The insertion loss is improved as indicated by the circled number "3" when a capacitance of 6.5 fF is added between the nodes A and C, namely, between the receive footpad $27_9$ and the middle point of the phase matching circuit 711. The insertion loss is further improved as indicated by the circled number "2" when a capacitance of 6.5 fF is added between the nodes A and D, namely, between the receive footpad $27_9$ and the front end of the phase matching circuit 711. It can be seen from the experimental results that the out-of-suppression can be improved by adding an appropriate capacitance between the footpad $27_6$ and the phase matching circuit 711. Preferably, the appropriate capacitance is equal to or less than 10 fF.

Eighth Embodiment

Figure 21C:
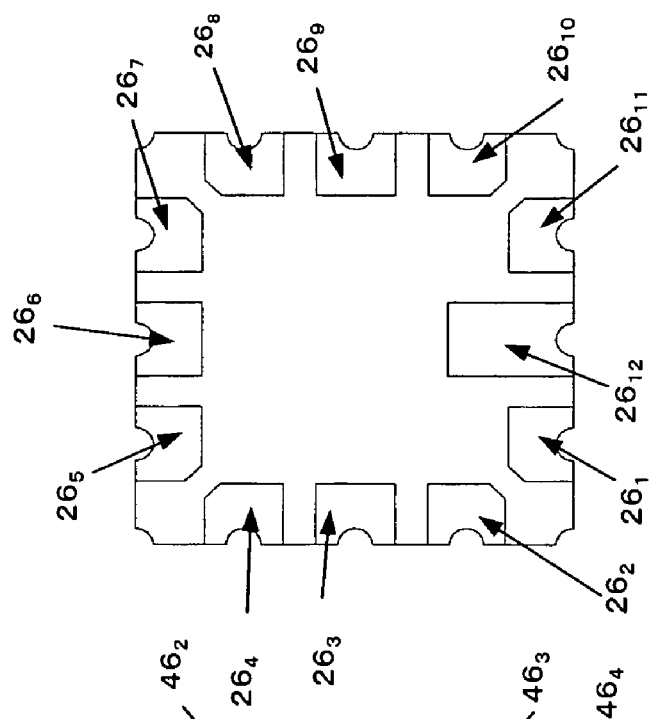
FIG. 21C shows the bottom surface of the common ground/footpad layer.
Figure 21B:
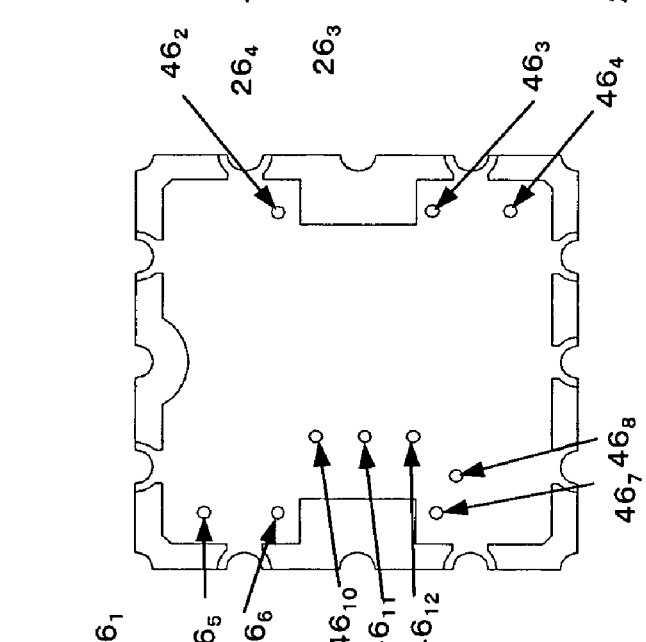
FIG. 21B shows the upper surface of a common ground/footpad layer of the package of the duplexer according to the eighth embodiment of the present invention.
Figure 21A:
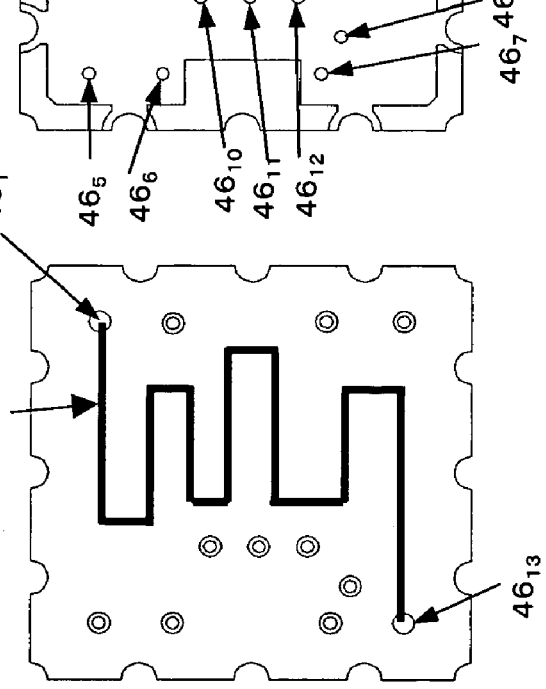
FIG. 21A is a plan view of a phase matching line pattern layer of a laminate package of a duplexer according to an eight embodiment of the present invention.

FIG. 21A shows a phase matching line pattern layer of a duplexer according to an eighth embodiment of the present invention, FIG. 21B shows the upper surface of a common ground/footpad layer, and FIG. 21C shows the lower surface thereof. FIG. 22 is a graph of a filter characteristic of the duplexer according to the eighth embodiment of the present invention, in which the horizontal axis denotes frequency (MHz) and the vertical axis denotes insertion loss (dB).

In FIG. 22, the broken line shows the filter characteristic of the conventional duplexer, and the solid line shows the filter characteristic of the duplexer according to the eight embodiment of the invention. The present duplexer has an arrangement in which a middle portion of a phase matching line pattern 832 is close to the receive footpad $26_9$, as shown in FIGS. 21A through 21C.

The capacitance between the receive circuit and the common circuit (ground) can be adjusted by changing the position of the portion of the phase matching line pattern 832 close to the receive footpad $26_9$. The phase matching line pattern 832 may have a portion close to the transmit footpad $26_3$. In this case, the capacitance between the transmit circuit and the common circuit may be adjusted. The capacitance appropriately adjusted improves the out-of-band suppression. The parasitic impedance of the package may be adjusted by controlling the dielectric constant of the package and the distance between the phase matching circuit and the transmit and/or receive circuit. This improves suppression by adjustment of the bridging capacitance. The filter characteristics can be stabilized by forming the phase matching circuit, the transmit circuit and the receive circuit by line patterns.

Ninth Embodiment

Figure 23:
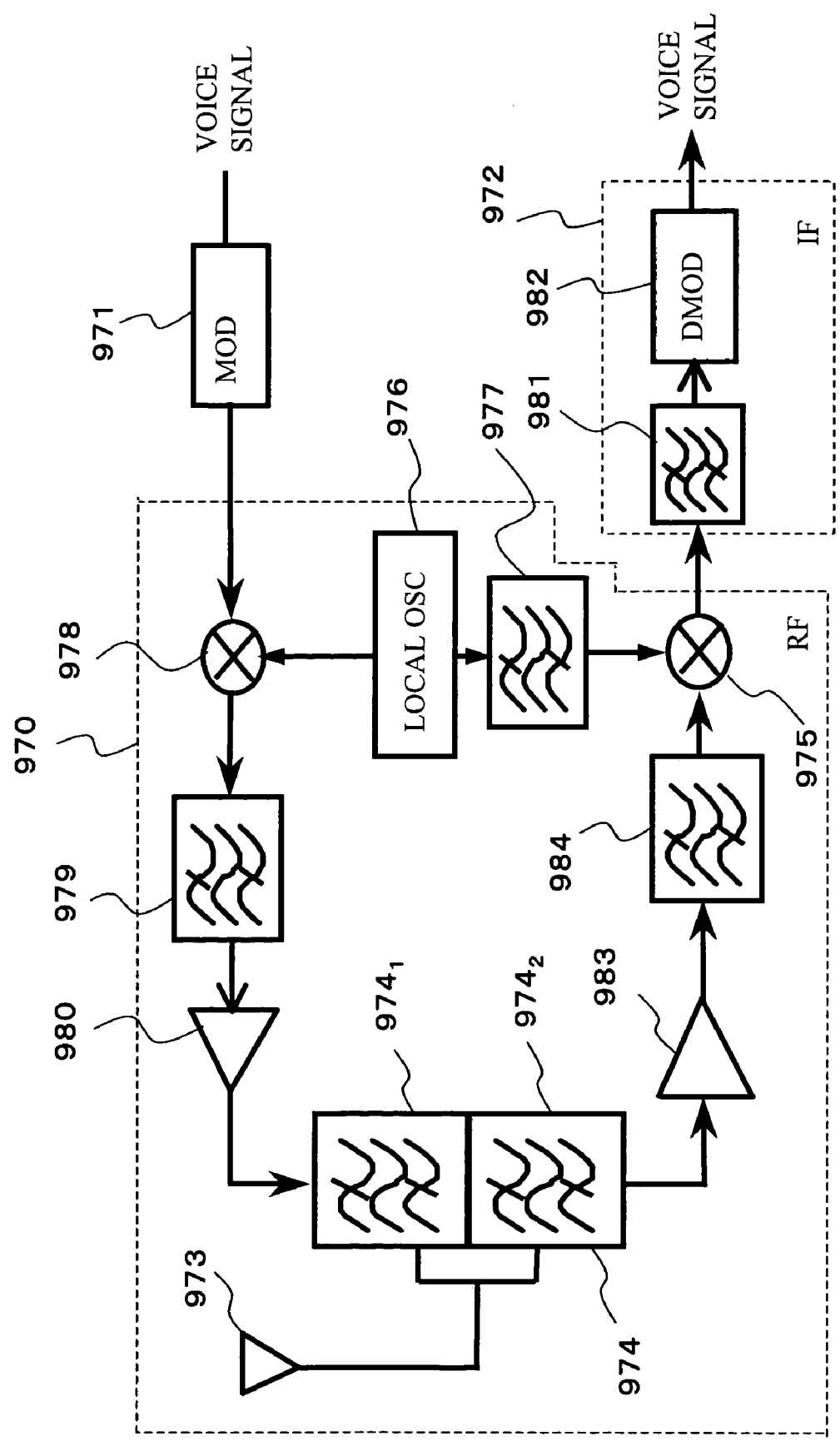
FIG. 23 is a block diagram of an electronic apparatus according to a ninth embodiment of the present invention.

FIG. 23 is a block diagram of an electronic apparatus equipped with any of the above-mentioned duplexers of the invention. The electronic apparatus is a cellular phone, and FIG. 23 shows transmit and receive systems thereof. The other structural parts such as a voice processing system of the cellular phone are omitted from FIG. 23 for the sake of simplicity.

The cellular phone has an RF (Radio Frequency) part 970, a modulator 971 and IF (Intermediate Frequency) part 972. The RF part 970 includes an antenna 973, a duplexer 974, a low-noise amplifier 983, an inter-stage filter 984, a mixer (multiplier) 975, a local oscillator 976, an inter-stage filter 977, a mixer (multiplier) 978, an inter-stage filter 979 and a power amplifier 980. A voice signal from the voice processing system is modulated by the modulator 971. The modulated signal is mixed with a local signal from the local oscillator 976 by the mixer 978 of the RF part 970. The up-converted signal of the mixer 978 thus obtained passes through the inter-stage filter 979 and the power amplifier 980, and is applied to the duplexer 974.

The duplexer 974 has a transmit filter $974_1$, a receive filer $974_2$, and a phase matching circuit (not shown), and is formed by any of the duplexers of the invention. The transmit signal from the power amplifier 980 is applied to the antenna 973 through the transmit filter $974_1$ of the duplexer 974. The receive signal from the antenna 973 passes through the receive filter $974_2$ of the duplexer 974, and is applied to the mixer 975 via the low-noise amplifier 283 and the inter-stage filter 984. The mixer 975 receives the local signal from the local oscillator 976 via the inter-stage filter 977, and mixes it with the received signal. The down-converted signal of the mixer 975 thus obtained is applied to the IF part 972, in which the modulator 982 receives the down-converted signal via the inter-stage filter 981 and demodulates it into the original voice signal.

The cellular phone shown in FIG. 23 equipped with the duplexer of the present invention has a miniaturized size and excellent filter characteristics.

The present invention is not limited to the specifically disclosed embodiments, and other embodiments, variations and modifications may be made without departing from the scope of the present invention.

The present application is based on Japanese Patent Application No. 2003-126089 filed on Apr. 30, 2003, the entire disclosure of which is hereby incorporated by reference.

What is claimed is:

1. A duplexer comprising:

transmit and receive surface acoustic wave (SAW) filters having different center frequencies, the transmit SAW filter being connected between a transmit terminal and a common terminal, the receive SAW filter being connected between a receive terminal and the common terminal;

a phase matching circuit that matches phases of the two SAW filters;

a package in which the SAW filters and the phase matching circuit are housed, the package being composed of multiple layers; and a line pattern provided between the receive SAW filter and the receive terminal, the line pattern running on at least two of the multiple layers within a range defined by horizontally opposing ground patterns provided on a surface of a layer of the multiple layers, a part of the line pattern running on the surface of the layer, said range being defined between a side of an opening of the package in which the SAW filters are housed and a corresponding outer side of the package.

2. The duplexer as claimed in claim 1, wherein:

the line pattern has a first part provided on a first one of the multiple layers and a second part provided on a second one of the multiple layers; and the first and second parts are substantially orthogonal to each other.

3. The duplexer as claimed in claim 1, wherein:

the line pattern has a first part provided on a first one of the multiple layers and a second part provided on a second one of the multiple layers; and the first and second parts include portions that do not overlap each other in parallel.

4. The duplexer as claimed in claim 1, wherein the line pattern is sandwiched only between upper and lower ground patterns provided on layers just above and below said at least two of layers.

5. The duplexer as claimed in claim 1, further comprising a specific ground pattern for impedance adjustment provided on one of the multiple layers located above or below said at least two of the multiple layers.

6. The duplexer as claimed in claim 1, wherein:

the line pattern has a first part provided on a first one of the multiple layers and a second part provided on a second one of the multiple layers; and the first part is interposed between ground lines provided on the first one of the multiple layers.

7. The duplexer as claimed in claim 1, wherein:

the line pattern has a first part provided on a first one of the multiple layers and a second part provided on a second one of the multiple layers; and the first and second parts have curved portions.

8. The duplexer recited in claim 1, wherein:

one of the multiple layers has a first surface on which at least one of a transmit footpad and a receive footpad is provided, and a second surface on which a ground pattern is provided so as not to overlap said one of the transmit footpad and the receive footpad.

9. The duplexer recited in claim 1, wherein:

the multiple layers have a first layer on which a transmit footpad or a receive footpad is provided, and a second layer on which the phase matching circuit is provided, the first and second layers being next to each other, the phase matching circuit has a line pattern having a portion close to one of the transmit and receive footpads.

10. An electronic apparatus comprising:

an antenna;

a duplexer connected to the antenna; and transmit and receive systems connected to the duplexer, the duplexer comprising:

transmit and receive surface acoustic wave (SAW) filters having different center frequencies, the transmit SAW filter being connected between a transmit terminal and a common terminal, the receive SAW filter being connected between a receive terminal and the common terminal;

a phase matching circuit that matches phases of the two SAW filters;

a package in which the SAW filters and the phase matching circuit are housed, the package being composed of multiple layers; and a line pattern provided between the receive SAW filter and the receive terminal, the line pattern running on at least two of the multiple layers within a range defined by horizontally opposing ground patterns provided on a surface of a layer of the multiple layers, a part of the line pattern running on the surface of the layer, said range being defined between a side of an opening of the package in which the SAW filters are housed and a corresponding outer side of the package.

* * * * *